(12) United States Patent
Shim et al.

(10) Patent No.: US 10,727,025 B2
(45) Date of Patent: Jul. 28, 2020

(54) SYSTEM AND METHOD OF ANALYZING A CRYSTAL DEFECT

(71) Applicant: SAMSUNG ELECTRONICS CO., LTD., Suwon-si, Gyeonggi-Do (KR)

(72) Inventors: Sung-Bo Shim, Hwaseong-si (KR); Il-Gyou Shin, Hwaseong-si (KR); Seon-Young Lee, Seoul (KR); Alexander Schmidt, Suwon-si (KR); Shin-Wook Yi, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/257,895

(22) Filed: Jan. 25, 2019

(65) Prior Publication Data

US 2020/0020506 A1 Jan. 16, 2020

(30) Foreign Application Priority Data

Jul. 10, 2018 (KR) .................. 10-2018-0080243

(51) Int. Cl.
*H01J 37/26* (2006.01)
*G01N 23/20058* (2018.01)

(52) U.S. Cl.
CPC ........ *H01J 37/26* (2013.01); *G01N 23/20058* (2013.01); *H01J 2237/221* (2013.01); *H01J 2237/2617* (2013.01)

(58) Field of Classification Search
CPC .............. H01J 37/26; H01J 2237/221; H01J 2237/2617; G01N 23/20058

USPC .................. 250/306, 307, 309, 310, 311
See application file for complete search history.

(56) References Cited

U.S. PATENT DOCUMENTS

| 6,448,556 | B1* | 9/2002 | Cowley ................... H01J 37/12 250/311 |
|---|---|---|---|
| 7,449,898 | B2 | 11/2008 | Honda et al. |
| 8,674,329 | B2 | 3/2014 | Budach et al. |
| 9,390,517 | B2 | 7/2016 | Kwon et al. |
| 9,551,674 | B1* | 1/2017 | Wang ..................... G01N 23/04 |
| 9,595,091 | B2 | 3/2017 | Kaizerman |
| 9,779,910 | B1 | 10/2017 | Senowitz |
| 2002/0021537 | A1* | 2/2002 | Hasegawa .............. B82Y 10/00 360/324.11 |

(Continued)

FOREIGN PATENT DOCUMENTS

| JP | 3405338 | 3/2003 |
|---|---|---|
| JP | 6094898 | 2/2017 |

(Continued)

*Primary Examiner* — Nicole M Ippolito
(74) *Attorney, Agent, or Firm* — F. Chau & Associates, LLC

(57) ABSTRACT

A system of analyzing a crystal defect includes an image processor, an image generator, and a comparator. The image processor processes a measured transmission electron microscope (TEM) image that is provided by capturing an image of a specimen having a crystal structure, to provide structural defect information of the specimen. The image generator provides a plurality of virtual TEM images corresponding to a plurality of three-dimensional structural defects of the crystal structure. The comparator compares the measured TEM image with the plurality of virtual TEM images using the structural defect information to determine a defect type of the measured TEM image.

20 Claims, 27 Drawing Sheets

(56) References Cited

U.S. PATENT DOCUMENTS

| | | |
|---|---|---|
| 2005/0061974 A1 | 3/2005 | Kim et al. |
| 2014/0204194 A1 | 7/2014 | Otani et al. |
| 2014/0307052 A1 | 10/2014 | Ahn et al. |
| 2014/0341469 A1 | 11/2014 | Hisaki |
| 2017/0061604 A1 | 3/2017 | Pandev |
| 2018/0103247 A1 | 4/2018 | Kolchin et al. |

FOREIGN PATENT DOCUMENTS

| | | |
|---|---|---|
| KR | 10-2005-0029762 | 3/2005 |
| KR | 10-0531950 | 11/2005 |
| KR | 10-0574648 | 4/2006 |
| KR | 10-2014-0122608 | 10/2014 |
| KR | 10-2018-0037281 | 4/2018 |

\* cited by examiner

FIG. 5B

| v | c(v) | v | c(v) | v | c(v) | v | c(v) | v | c(v) |
|---|---|---|---|---|---|---|---|---|---|
| 52 | 1 | 64 | 2 | 72 | 1 | 85 | 2 | 113 | 1 |
| 55 | 3 | 65 | 3 | 73 | 2 | 87 | 1 | 122 | 1 |
| 58 | 2 | 66 | 2 | 75 | 1 | 88 | 1 | 126 | 1 |
| 59 | 3 | 67 | 1 | 76 | 1 | 90 | 1 | 144 | 1 |
| 60 | 1 | 68 | 5 | 77 | 1 | 94 | 1 | 154 | 1 |
| 61 | 4 | 69 | 3 | 78 | 2 | 104 | 2 | | |
| 62 | 1 | 70 | 4 | 79 | 1 | 106 | 1 | | |
| 63 | 2 | 71 | 2 | 83 | 1 | 109 | 1 | | |

FIG. 6

| v | cdf(v) | h(v) | ch(v) |
|---|---|---|---|
| 52 | 1 | 0 | 0 |
| 55 | 4 | 12 | 11 |
| 58 | 6 | 20 | 18 |
| 59 | 9 | 32 | 29 |
| 60 | 10 | 36 | 33 |
| 61 | 14 | 53 | 53 |
| 62 | 15 | 57 | 57 |
| 63 | 17 | 65 | 65 |
| 64 | 19 | 73 | 73 |
| 65 | 22 | 85 | 85 |
| 66 | 24 | 93 | 93 |
| 67 | 25 | 97 | 97 |
| 68 | 30 | 117 | 117 |
| 69 | 33 | 130 | 130 |
| 70 | 37 | 146 | 146 |
| 71 | 39 | 154 | 154 |
| 72 | 40 | 158 | 158 |
| 73 | 42 | 166 | 166 |
| 75 | 43 | 170 | 170 |
| 76 | 44 | 174 | 174 |
| 77 | 45 | 178 | 178 |
| 78 | 46 | 182 | 182 |
| 79 | 48 | 190 | 190 |
| 83 | 49 | 194 | 194 |
| 85 | 51 | 202 | 202 |
| 87 | 52 | 206 | 215 |
| 88 | 53 | 210 | 219 |
| 90 | 54 | 215 | 223 |
| 94 | 55 | 219 | 227 |
| 104 | 57 | 227 | 236 |
| 106 | 58 | 231 | 240 |
| 109 | 59 | 235 | 244 |
| 113 | 60 | 239 | 248 |
| 122 | 61 | 243 | 252 |
| 126 | 62 | 247 | 255 |
| 144 | 63 | 251 | 255 |
| 154 | 64 | 255 | 255 |

— PXL (upper region)
— PXH (lower region)

FIG. 12A

| | C1 | C2 | C3 | C4 | C5 | C6 | C7 | C8 | C9 | C10 | C11 | C12 | C13 | C14 | C15 | C16 | C17 | C18 | C19 | C20 |
|---|---|---|---|---|---|---|---|---|---|---|---|---|---|---|---|---|---|---|---|---|
| R1 | 70 | 163 | 223 | 212 | 119 | 42 | 22 | 36 | 84 | 133 | 123 | 70 | 31 | 22 | 38 | 75 | 102 | 87 | 53 | 34 |
| R2 | 84 | 133 | 181 | 181 | 123 | 60 | 36 | 46 | 81 | 115 | 112 | 67 | 28 | 17 | 25 | 58 | 93 | 96 | 65 | 34 |
| R3 | 102 | 87 | 96 | 115 | 112 | 87 | 62 | 55 | 62 | 73 | 73 | 60 | 36 | 22 | 25 | 44 | 75 | 90 | 70 | 38 |
| R4 | 115 | 53 | 40 | 60 | 96 | 112 | 96 | 67 | 49 | 38 | 44 | 58 | 58 | 42 | 33 | 40 | 58 | 73 | 65 | 42 |
| R5 | 115 | 42 | 23 | 40 | 84 | 123 | 118 | 84 | 44 | 28 | 31 | 62 | 87 | 75 | 53 | 44 | 46 | 53 | 49 | 38 |
| R6 | 105 | 53 | 33 | 40 | 73 | 112 | 126 | 99 | 60 | 33 | 31 | 60 | 96 | 99 | 75 | 53 | 42 | 34 | 28 | 25 |
| R7 | 96 | 84 | 70 | 62 | 67 | 87 | 112 | 119 | 93 | 55 | 38 | 49 | 75 | 90 | 84 | 67 | 44 | 25 | 14 | 13 |
| R8 | 93 | 141 | 141 | 102 | 73 | 70 | 96 | 133 | 137 | 93 | 51 | 34 | 42 | 60 | 75 | 76 | 49 | 20 | 8 | 8 |
| R9 | 96 | 181 | 201 | 152 | 87 | 65 | 90 | 145 | 174 | 133 | 61 | 28 | 22 | 29 | 51 | 70 | 55 | 23 | 9 | 8 |
| R10 | 96 | 178 | 204 | 171 | 105 | 73 | 84 | 137 | 171 | 141 | 78 | 28 | 15 | 16 | 31 | 53 | 53 | 31 | 16 | 15 |
| R11 | 78 | 123 | 152 | 141 | 105 | 78 | 75 | 96 | 115 | 99 | 62 | 33 | 17 | 13 | 18 | 31 | 40 | 36 | 29 | 29 |
| R12 | 60 | 62 | 75 | 96 | 102 | 84 | 65 | 55 | 53 | 49 | 46 | 40 | 28 | 16 | 13 | 17 | 26 | 36 | 42 | 44 |
| R13 | 51 | 33 | 40 | 73 | 109 | 102 | 65 | 31 | 19 | 22 | 36 | 53 | 46 | 26 | 13 | 12 | 20 | 40 | 58 | 60 |
| R14 | 55 | 31 | 36 | 78 | 133 | 133 | 75 | 28 | 13 | 17 | 38 | 70 | 73 | 42 | 17 | 13 | 22 | 51 | 84 | 81 |
| R15 | 65 | 42 | 53 | 96 | 145 | 141 | 84 | 36 | 18 | 22 | 44 | 75 | 81 | 51 | 23 | 17 | 29 | 67 | 109 | 105 |
| R16 | 60 | 55 | 65 | 90 | 112 | 105 | 70 | 42 | 31 | 31 | 41 | 58 | 58 | 40 | 25 | 23 | 36 | 70 | 102 | 102 |
| R17 | 42 | 60 | 67 | 67 | 58 | 49 | 44 | 46 | 46 | 40 | 31 | 28 | 26 | 26 | 26 | 31 | 40 | 53 | 67 | 65 |
| R18 | 34 | 62 | 70 | 46 | 23 | 17 | 25 | 49 | 65 | 51 | 26 | 14 | 13 | 18 | 31 | 42 | 44 | 38 | 31 | 31 |
| R19 | 42 | 70 | 67 | 34 | 13 | 9 | 19 | 49 | 75 | 62 | 29 | 13 | 11 | 22 | 42 | 60 | 55 | 33 | 20 | 19 |
| R20 | 58 | 67 | 53 | 26 | 13 | 12 | 22 | 46 | 67 | 62 | 38 | 22 | 22 | 34 | 55 | 73 | 65 | 40 | 25 | 25 |

FIG. 12B

| | C1 | C2 | C3 | C4 | C5 | C6 | C7 | C8 | C9 | C10 | C11 | C12 | C13 | C14 | C15 | C16 | C17 | C18 | C19 | C20 |
|---|---|---|---|---|---|---|---|---|---|---|---|---|---|---|---|---|---|---|---|---|
| R1 | 70 | 163 | 223 | 212 | 119 | 42 | 22 | 36 | 84 | 133 | 133 | 70 | 31 | 22 | 38 | 75 | 102 | 87 | 53 | 34 |
| R2 | 84 | 133 | 181 | 181 | 123 | 60 | 36 | 46 | 81 | 115 | 112 | 67 | 28 | 17 | 25 | 58 | 87 | 96 | 65 | 34 |
| R3 | 102 | 87 | 96 | 115 | 112 | 87 | 62 | 55 | 62 | 73 | 75 | 60 | 36 | 22 | 25 | 44 | 75 | 90 | 70 | 38 |
| R4 | 115 | 53 | 40 | 60 | 96 | 112 | 96 | 87 | 49 | 38 | 46 | 58 | 58 | 42 | 33 | 40 | 58 | 73 | 65 | 42 |
| R5 | 115 | 42 | 23 | 40 | 84 | 123 | 119 | 84 | 44 | 28 | 31 | 62 | 87 | 75 | 53 | 44 | 46 | 53 | 49 | 38 |
| R6 | 105 | 53 | 33 | 40 | 73 | 112 | 126 | 99 | 60 | 33 | 33 | 60 | 96 | 99 | 75 | 53 | 42 | 34 | 28 | 25 |
| R7 | 96 | 84 | 70 | 62 | 67 | 87 | 112 | 119 | 93 | 55 | 38 | 49 | 75 | 90 | 84 | 67 | 44 | 25 | 14 | 13 |
| R8 | 93 | 141 | 141 | 102 | 75 | 70 | 96 | 133 | 137 | 93 | 51 | 34 | 42 | 60 | 75 | 76 | 49 | 20 | 8 | 8 |
| R9 | 96 | 181 | 201 | 152 | 87 | 65 | 90 | 145 | 174 | 133 | 66 | 28 | 22 | 29 | 51 | 70 | 55 | 23 | 9 | 8 |
| R10 | 96 | 178 | 204 | 171 | 105 | 73 | 84 | 137 | 171 | 141 | 70 | 28 | 15 | 16 | 31 | 53 | 53 | 31 | 16 | 15 |
| R11 | 78 | 128 | 152 | 141 | 105 | 78 | 75 | 96 | 115 | 99 | 62 | 33 | 17 | 13 | 18 | 31 | 40 | 36 | 29 | 29 |
| R12 | 60 | 62 | 75 | 96 | 102 | 84 | 65 | 55 | 53 | 49 | 46 | 40 | 28 | 16 | 13 | 17 | 26 | 36 | 42 | 44 |
| R13 | 51 | 33 | 40 | 73 | 109 | 102 | 65 | 31 | 19 | 22 | 35 | 53 | 46 | 26 | 13 | 12 | 20 | 40 | 58 | 60 |
| R14 | 55 | 31 | 38 | 70 | 133 | 133 | 75 | 28 | 13 | 17 | 38 | 70 | 73 | 42 | 17 | 13 | 22 | 51 | 84 | 81 |
| R15 | 65 | 42 | 53 | 96 | 146 | 141 | 84 | 36 | 18 | 22 | 44 | 75 | 81 | 51 | 23 | 17 | 29 | 67 | 100 | 105 |
| R16 | 60 | 55 | 65 | 90 | 112 | 105 | 70 | 42 | 31 | 31 | 48 | 58 | 58 | 40 | 25 | 23 | 36 | 70 | 102 | 102 |
| R17 | 42 | 60 | 67 | 67 | 58 | 49 | 44 | 46 | 46 | 40 | 33 | 28 | 26 | 26 | 26 | 31 | 40 | 53 | 67 | 65 |
| R18 | 34 | 62 | 70 | 46 | 23 | 17 | 25 | 49 | 65 | 51 | 25 | 14 | 13 | 18 | 31 | 42 | 44 | 38 | 31 | 31 |
| R19 | 42 | 70 | 67 | 34 | 13 | 9 | 19 | 49 | 75 | 62 | 28 | 13 | 11 | 22 | 42 | 60 | 55 | 33 | 20 | 19 |
| R20 | 58 | 67 | 53 | 26 | 13 | 12 | 22 | 46 | 67 | 62 | 38 | 23 | 22 | 34 | 55 | 73 | 65 | 40 | 25 | 25 |

| | C1 | C2 | C3 | C4 | C5 | C6 | C7 | C8 | C9 | C10 | C11 | C12 | C13 | C14 | C15 | C16 | C17 | C18 | C19 | C20 |
|---|---|---|---|---|---|---|---|---|---|---|---|---|---|---|---|---|---|---|---|---|
| R1 | 0 | 0 | 0 | 0 | 0 | 0 | 0 | 0 | 0 | 0 | 0 | 0 | 0 | 0 | 0 | 0 | 0 | 0 | 0 | 0 |
| R2 | 0 | 0 | 0 | 0 | 0 | 0 | 0 | 0 | 0 | 0 | 0 | 0 | 0 | 0 | 0 | 0 | 0 | 0 | 0 | 0 |
| R3 | 0 | 0 | 0 | 0 | 0 | 0 | 0 | 0 | 0 | 0 | 0 | 0 | 0 | 0 | 0 | 0 | 0 | 0 | 0 | 0 |
| R4 | 0 | 0 | 0 | 0 | 0 | 0 | 0 | 0 | 0 | 0 | 0 | 0 | 0 | 0 | 0 | 0 | 0 | 0 | 0 | 0 |
| R5 | 0 | 0 | 0 | 0 | 0 | 0 | 0 | 0 | 0 | 0 | 0 | 0 | 0 | 0 | 0 | 0 | 0 | 0 | 0 | 0 |
| R6 | 0 | 0 | 0 | 0 | 0 | 0 | 0 | 0 | 0 | 0 | 0 | 0 | 0 | 0 | 0 | 0 | 0 | 0 | 0 | 0 |
| R7 | 0 | 0 | 0 | 0 | 0 | 0 | 0 | 0 | 0 | 0 | 0 | 0 | 0 | 0 | 0 | 67 | 0 | 0 | 0 | 0 |
| R8 | 0 | 0 | 0 | 0 | 0 | 0 | 0 | 0 | 0 | 0 | 0 | 0 | 0 | 0 | 0 | 76 | 0 | 0 | 0 | 0 |
| R9 | 0 | 0 | 0 | 0 | 0 | 0 | 0 | 0 | 0 | 0 | 0 | 0 | 0 | 0 | 51 | 0 | 0 | 0 | 0 | 0 |
| R10 | 0 | 0 | 0 | 0 | 0 | 0 | 0 | 0 | 0 | 0 | 0 | 0 | 0 | 16 | 0 | 0 | 0 | 0 | 0 | 0 |
| R11 | 0 | 0 | 0 | 0 | 0 | 0 | 0 | 0 | 0 | 0 | 0 | 0 | 17 | 0 | 0 | 0 | 0 | 0 | 0 | 0 |
| R12 | 0 | 0 | 0 | 0 | 0 | 0 | 0 | 0 | 0 | 0 | 0 | 0 | 28 | 0 | 0 | 0 | 0 | 0 | 0 | 0 |
| R13 | 0 | 0 | 0 | 0 | 0 | 0 | 0 | 0 | 0 | 0 | 0 | 0 | 46 | 0 | 0 | 0 | 0 | 0 | 0 | 0 |
| R14 | 0 | 0 | 0 | 0 | 0 | 0 | 0 | 0 | 0 | 0 | 0 | 0 | 73 | 0 | 0 | 0 | 0 | 0 | 0 | 0 |
| R15 | 0 | 0 | 0 | 0 | 0 | 0 | 0 | 0 | 0 | 0 | 0 | 0 | 81 | 0 | 0 | 0 | 0 | 0 | 0 | 0 |
| R16 | 0 | 0 | 0 | 0 | 0 | 0 | 0 | 0 | 0 | 0 | 0 | 58 | 0 | 0 | 0 | 0 | 0 | 0 | 0 | 0 |
| R17 | 0 | 0 | 0 | 0 | 0 | 0 | 0 | 0 | 0 | 40 | 33 | 0 | 0 | 0 | 0 | 0 | 0 | 0 | 0 | 0 |
| R18 | 0 | 0 | 0 | 0 | 0 | 0 | 0 | 0 | 65 | 51 | 0 | 0 | 0 | 0 | 0 | 0 | 0 | 0 | 0 | 0 |
| R19 | 0 | 0 | 0 | 0 | 0 | 0 | 0 | 0 | 75 | 0 | 0 | 0 | 0 | 0 | 0 | 0 | 0 | 0 | 0 | 0 |
| R20 | 0 | 0 | 0 | 0 | 0 | 0 | 0 | 0 | 67 | 0 | 0 | 0 | 0 | 0 | 0 | 0 | 0 | 0 | 0 | 0 |

{110}PLANE

SYSTEM AND METHOD OF ANALYZING A CRYSTAL DEFECT

CROSS-REFERENCE TO RELATED APPLICATION

This U.S. non-provisional application claims priority under 35 U.S.C. § 119 to Korean Patent Application No. 10-2018-0080243, filed on Jul. 10, 2018 in the Korean Intellectual Property Office (KIPO), the disclosure of which is incorporated by reference herein in its entirety.

TECHNICAL FIELD

Exemplary embodiments of the inventive concept relate generally to semiconductor integrated circuits, and more particularly to a system and method of analyzing crystal defects.

DISCUSSION OF RELATED ART

Recently, electron diffraction using a transmission electron microscope (TEM) has been widely used to analyze a minute structure of materials. For example, convergent beam electron diffraction (CBED) may be used to provide a measured TEM image for measuring a crystal structure, a defect distribution, etc. of a specimen portion on a nanometer scale.

CBED is a technique of analyzing a minute structure of materials using the TEM such that an electron beam is incident on the target specimen with a convergence angle to obtain a diffraction disk pattern and observe three-dimensional diffraction by a thick portion of the specimen. CBED has an excellent space resolution and can accurately measure a crystal structure, a lattice constant, a lattice defect etc. of a minute structure of about 30 nanometers.

According to conventional methods of analyzing crystal defects in a structure manufactured by a semiconductor process, such as a logic FinFET process, a TEM image of the structure is captured and an engineer determines existence of defects, defect locations, etc. through the naked eye. Such defect analysis based on the engineer's experience may result in human error, such as overlooking or misjudging defects. In addition, it may be difficult to determine a direction or a type of the defect through human eyes, and estimates of the semiconductor process may be inaccurate when the defect types are classified only based on empirical analysis.

SUMMARY

According to an exemplary embodiment of the inventive concept, a system of analyzing a crystal defect includes an image processor, an image generator, and a comparator. The image processor processes a measured transmission electron microscope (TEM) image that is provided by capturing an image of a specimen having a crystal structure, to provide structural defect information of the specimen. The image generator provides a plurality of virtual TEM images corresponding to a plurality of three-dimensional structural defects of the crystal structure. The comparator compares the measured TEM image with the plurality of virtual TEM images using the structural defect information to determine a defect type of the measured TEM image.

According to an exemplary embodiment of the inventive concept, a method of analyzing a crystal defect includes providing a measured transmission electron microscope (TEM) image by capturing an image of a specimen having a crystal structure, providing structural defect information of the specimen by processing the measured TEM image, providing a plurality of virtual TEM images corresponding to a plurality of three-dimensional structural defects of the crystal structure, and determining a defect type of the measured TEM image by comparing the measured TEM image with the plurality of virtual TEM images using the structural defect information.

According to an exemplary embodiment of the inventive concept, a method of analyzing a crystal defect includes providing a measured transmission electron microscope (TEM) image by capturing an image of a specimen having a crystal structure, providing an enforced image of the measured TEM image, where the enforced image has an increased contrast in comparison with the measured TEM image, tracing an atom arrangement pattern in a lattice direction using the enforced image to detect a defect line including defect pixels that are deviated from a periodicity of an atom arrangement pattern, determining a location of an end point of the defect line as a location of a dislocation core, providing a cropped image having a predetermined size and centered on the location of the dislocation core, where the cropped image corresponds to a portion of the measured TEM image or a portion of a processed image of the measured TEM image, providing a plurality of virtual TEM images corresponding to a plurality of three-dimensional structural defects of the crystal structure, and determining a defect type of the measured TEM image by comparing the cropped image with the plurality of virtual TEM images.

According to an exemplary embodiment of the inventive concept, a method of analyzing a crystal defect includes providing a measured transmission electron microscope (TEM) image by capturing an image of a specimen having a crystal structure, performing a customized histogram equalization of the measured TEM image to provide an enforced image of the measured TEM image, where the enforced image includes a plurality of customized pixel values arranged in a plurality of rows and a plurality of columns, determining downward pattern pixels according to a downward tracing scheme from a first row to a last row among the plurality of rows along a diagonal direction, determining upward pattern pixels according to an upward tracing scheme from the last row to the first row along the diagonal direction, determining defect candidate pixels by excluding redundant pixels from the downward pattern pixels and the upward pattern pixels, where the redundant pixels are pixels included in both the upward pattern pixels and the downward pattern pixels, determining, as noise pixels among the defect candidate pixels, the downward pattern pixels or the upward pattern pixels that are connected to one another by a number smaller than a reference number, determining a defect line by removing the noise pixels from the defect candidate pixels, and determining a location of an end point of the defect line as a location of a dislocation core.

BRIEF DESCRIPTION OF THE DRAWINGS

The above and other features of the inventive concept will be more clearly understood by describing in detail exemplary embodiments thereof with reference to the accompanying drawings.

FIG. 5B is a diagram illustrating a histogram of the measured TEM image of FIG. 5A according to an exemplary embodiment of the inventive concept.

FIG. 6 is a diagram illustrating a customized histogram equalization of the measured TEM image of FIG. 5A according to an exemplary embodiment of the inventive concept.

FIGS. 12A, 12B, 12C, 12D, 12E, and 12F are diagrams illustrating a procedure of detecting a defect line according to an exemplary embodiment of the inventive concept.

DETAILED DESCRIPTION OF THE EMBODIMENTS

Figure 1:
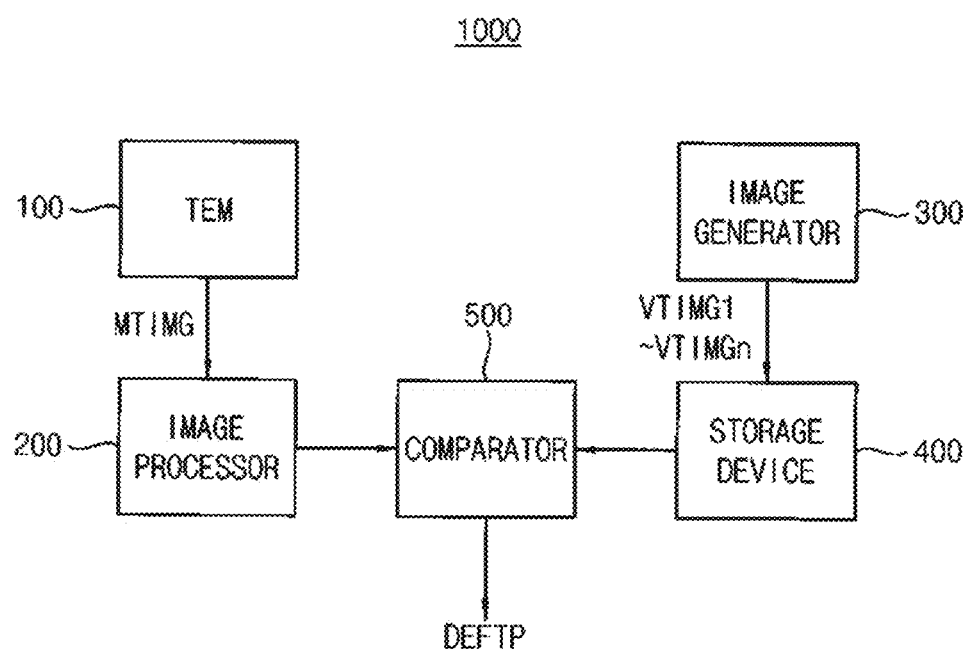
FIG. 1 is a block diagram illustrating a system of analyzing crystal defects according to an exemplary embodiment of the inventive concept.

Exemplary embodiments of the inventive concept provide a system and method of efficiently analyzing crystal defects.

Exemplary embodiments of the inventive concept will be described more fully hereinafter with reference to the accompanying drawings. Like reference numerals may refer to like elements throughout this application.

Figure 2:
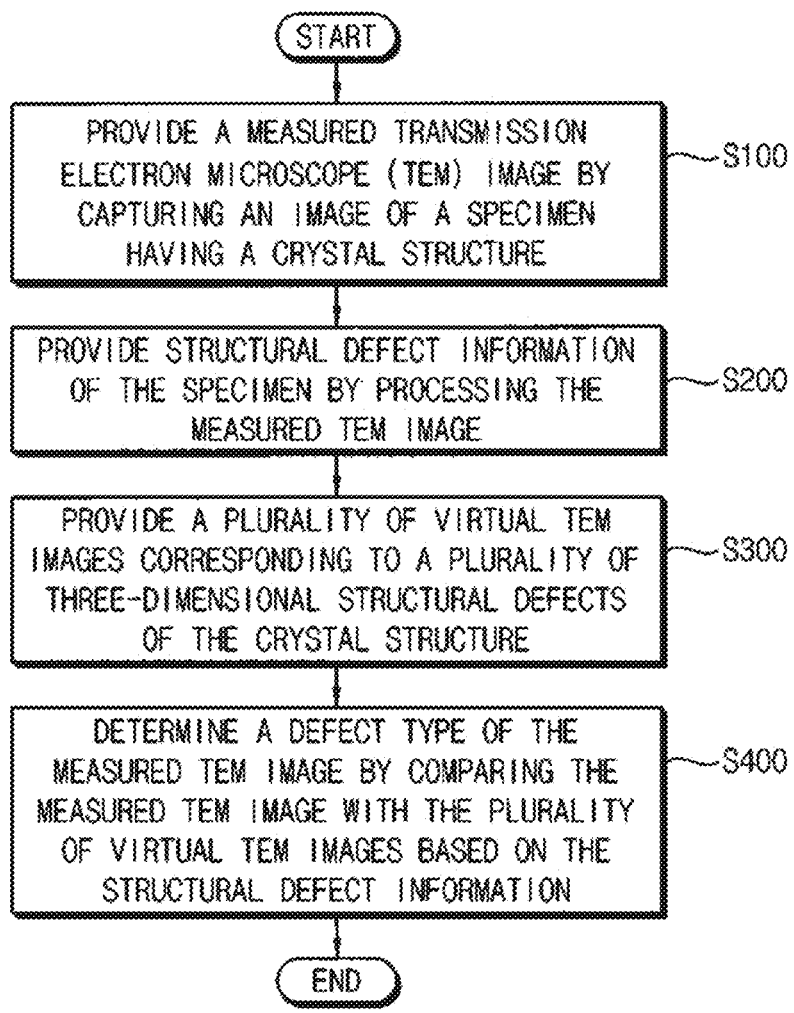
FIG. 2 is a flowchart illustrating a method of analyzing crystal defects according to an exemplary embodiment of the inventive concept.

FIG. 1 is a block diagram illustrating a system of analyzing crystal defects according to an exemplary embodiment of the inventive concept, and FIG. 2 is a flowchart illustrating a method of analyzing crystal defects according to an exemplary embodiment of the inventive concept.

Referring to FIG. 1, a crystal detection analysis system 1000 includes a transmission electron microscope (TEM) 100, an image processor 200, an image generator 300, a storage device 400 and a comparator 500.

Referring to FIGS. 1 and 2, the TEM 100 may provide a measured TEM image MTIMG by capturing an image of a specimen having a crystal structure (S100). The image processor 200 may provide structural defect information of the specimen by processing the measured TEM image MTIMG (S200). The image generator 300 may provide a plurality of virtual TEM images VTIMG1~VTIMGn corresponding to a plurality of three-dimensional structural defects of the crystal structure (S300). The storage device 400 may store the plurality of virtual TEM images VTIMG1~VTIMGn provided from the image generator 300. The comparator 500 may determine a defect type of the measured TEM image MTIMG by comparing the measured TEM image MTIMG with the plurality of virtual TEM images VTIMG1~VTIMGn based on the structural defect information (S400).

The image processor 200, as will be described below with reference to FIGS. 3 through 15B, may provide an enforced image of the measured TEM image MTIMG such that the enforced image has an increased contrast in comparison with the measured TEM image MTIMG. The image processor 200 may trace an atom arrangement pattern in a lattice direction based on the enforced image to detect a defect line including defect pixels that are deviated from a periodicity of the atomic arrangement pattern, and determine a location of an end point of the defect line as a location of a dislocation core. According to an exemplary embodiment of the inventive concept, the image processor 200 may provide a cropped image having a predetermined size and centered on the location of the dislocation core. The cropped image may correspond to a portion of the measured TEM image MTIMG or a portion of a processed image of the measured TEM image MTIMG.

The image generator 300, as will be described below with reference to FIGS. 16A and 16B, may divide an incident plane of an electron wave into a plurality of domains, set each three-dimensional structural defect as an arrangement of atoms disposed at corresponding locations on the incident plane, and calculate pixel values of each virtual TEM image corresponding to a three-dimensional structural defect.

The storage device 400 may store the plurality of virtual TEM images VTIMG1~VTIMGn or process images of the plurality of virtual TEM images VTIMG1~VTIMGn to provide the stored images to the comparator 500. According to an exemplary embodiment of the inventive concept, the storage device 400 may be omitted or included in the image generator 300. In this case, the plurality of virtual TEM images VTIMG1~VTIMGn may be provided directly from the image generator 300 to the comparator 500.

For example, the storage device 400 may be implemented with an electrically erasable programmable read-only memory (EEPROM), a flash memory, a phase change random access memory (PRAM), a resistive random access memory (RRAM), a nano floating gate memory (NFGM), a polymer random access memory (PoRAM), a magnetic random access memory(MRAM), a ferroelectric random access memory (FRAM), and so on.

Reverse engineering may be used to analyze a defect type of the detected defect. The number of defect types may be, for example, about 2000 in a three-dimensional crystal structure, and the three-dimensional structural defects may be reproduced into the plurality of virtual TEM images VTIMG1~VTIMGn.

A machine learning scheme, such as histogram of oriented gradients (HOG) scheme, support vector machine (SVM), speeded up robust features (SURF), convolutional neural network (CNN), etc., may be used to determine an image that is most similar to the measured TEM image MTIMG among the plurality of virtual TEM images VTIMG1~VTIMGn.

The comparator 500 may determine a matched virtual TEM image that is most similar to the measured TEM image MTIMG among the plurality of virtual TEM images VTIMG1~VTIMGn by performing such machine learning. The comparator 500 may determine a three-dimensional structural defect corresponding to the matched virtual TEM image as the defect type of the measured TEM image MTIMG.

In exemplary embodiments of the inventive concept, the comparator 500 may match a location of a dislocation core of the measured TEM image MTIMG with locations of dislocation cores of the plurality of virtual TEM images VTIMG1~VTIMGn to compare the measured TEM image MTIMG with the plurality of virtual TEM images VTIMG1~VTIMGn. The calculation of the machine learning may be reduced significantly by matching the locations of the dislocation cores.

As such, the system and method of analyzing the crystal defects according to exemplary embodiments of the inventive concept may prevent human errors in empirical analysis and efficiently estimate and improve the semiconductor processes, by analyzing three-dimensional structural defects through automation of image processing and defect detection as well as reverse engineering using virtual TEM images.

Figure 3:
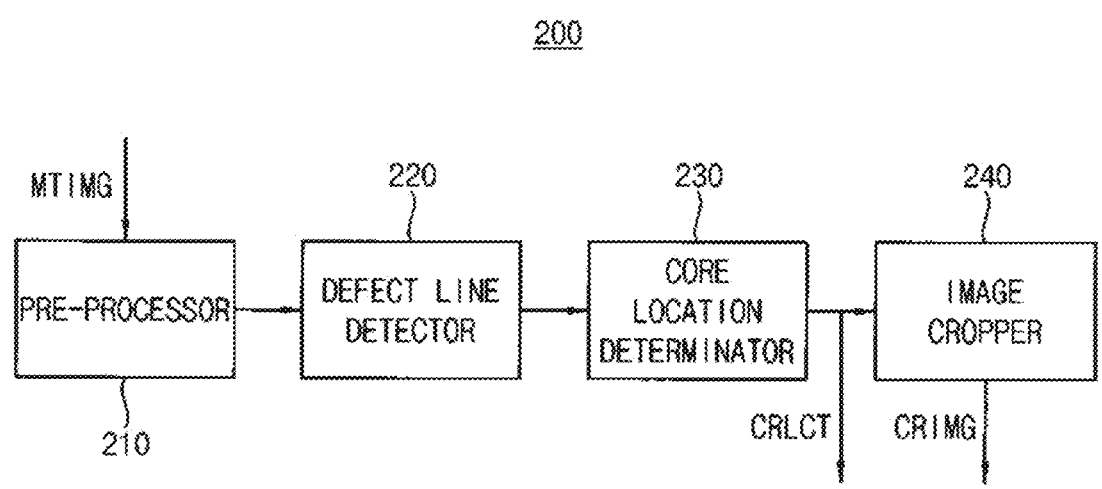
FIG. 3 is a block diagram illustrating an image processing device according to an exemplary embodiment of the inventive concept.
Figure 4:
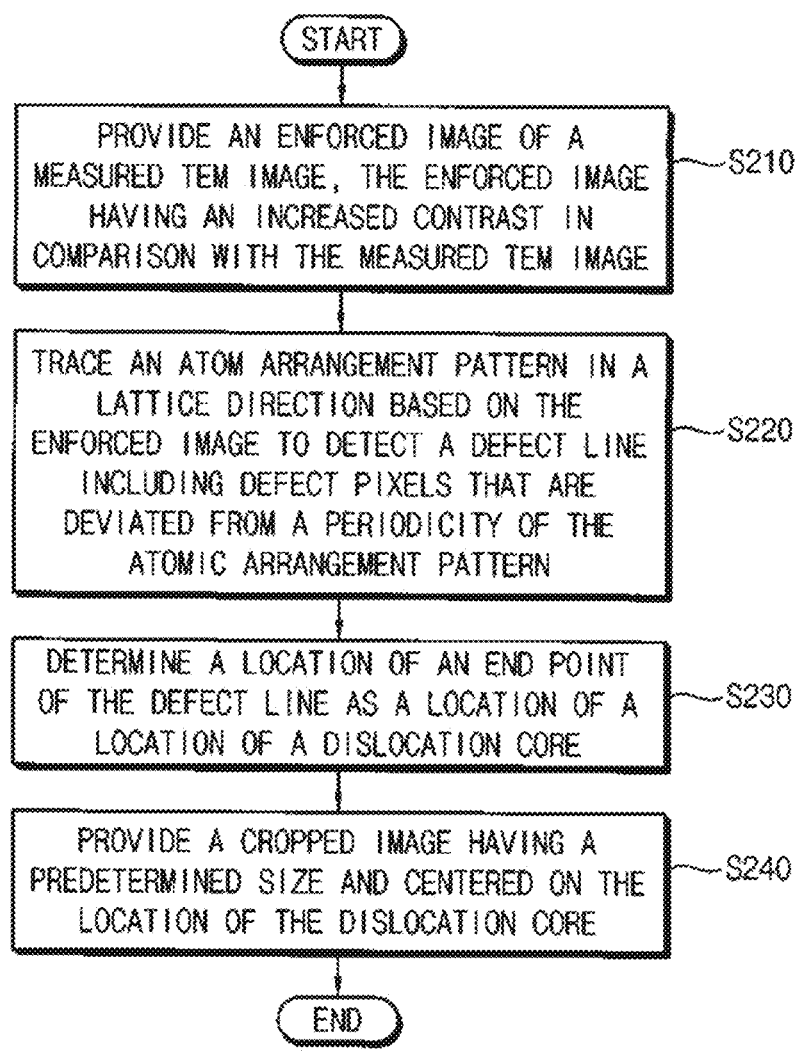
FIG. 4 is a flowchart illustrating an image processing method according to an exemplary embodiment of the inventive concept.

FIG. 3 is a block diagram illustrating an image processing device according to an exemplary embodiment of the inventive concept, and FIG. 4 is a flowchart illustrating an image processing method according to an exemplary embodiment of the inventive concept.

Referring to FIG. 3, the image processor 200 may include a pre-processor 210, a defect line detector 220, a core location determinator 230, and an image cropper 240.

Referring to FIGS. 3 and 4, the pre-processor 210 may provide an enforced image of the measured TEM image MTIMG, such that the enforced image has an increased contrast in comparison with the measured TEM image MTIMG (S210). The defect line detector 220 may trace an atom arrangement pattern in a lattice direction based on the enforced image to detect a defect line including defect pixels that are deviated from a periodicity of the atomic arrangement pattern (S220). The core location determinator 230 may determine a location CRLCT of an end point of the defect line as a location of a dislocation core (S230). The image cropper 240 may provide a cropped image CRIMG having a predetermined size and centered on the location of the dislocation core (S240).

The pre-processor 210, as will be described below with reference to FIGS. 5A through 10, may perform a customized histogram equalization to provide the enforced image.

The defect line detector 220, as will be described below with reference to FIGS. 11 through 13C, may determine downward pattern pixels according to a downward tracing scheme along a diagonal direction, and determine upward pattern pixels according to an upward tracing scheme along the diagonal direction. The defect line detector 220 may determine defect candidate pixels by excluding redundant pixels from the downward pattern pixels and the upward pattern pixels, determine, as noise pixels among the defect candidate pixels, the downward pattern pixels or the upward pattern pixels that are connected to one another by a number smaller than a reference number, and determine the defect line by removing the noise pixels from the defect candidate pixels.

In exemplary embodiments of the inventive concept, the core location determinator 230 may determine which end point among both end points of the defect line is nearer to an image center, and determine the location of the end point nearer to the image center as the location of the dislocation core CRLCT.

The image cropper 240 may crop a portion of the measured TEM image MTIMG or a portion of a processed image of the measured TEM image MTIMG as the cropped image CRIMG.

Figure 5A:
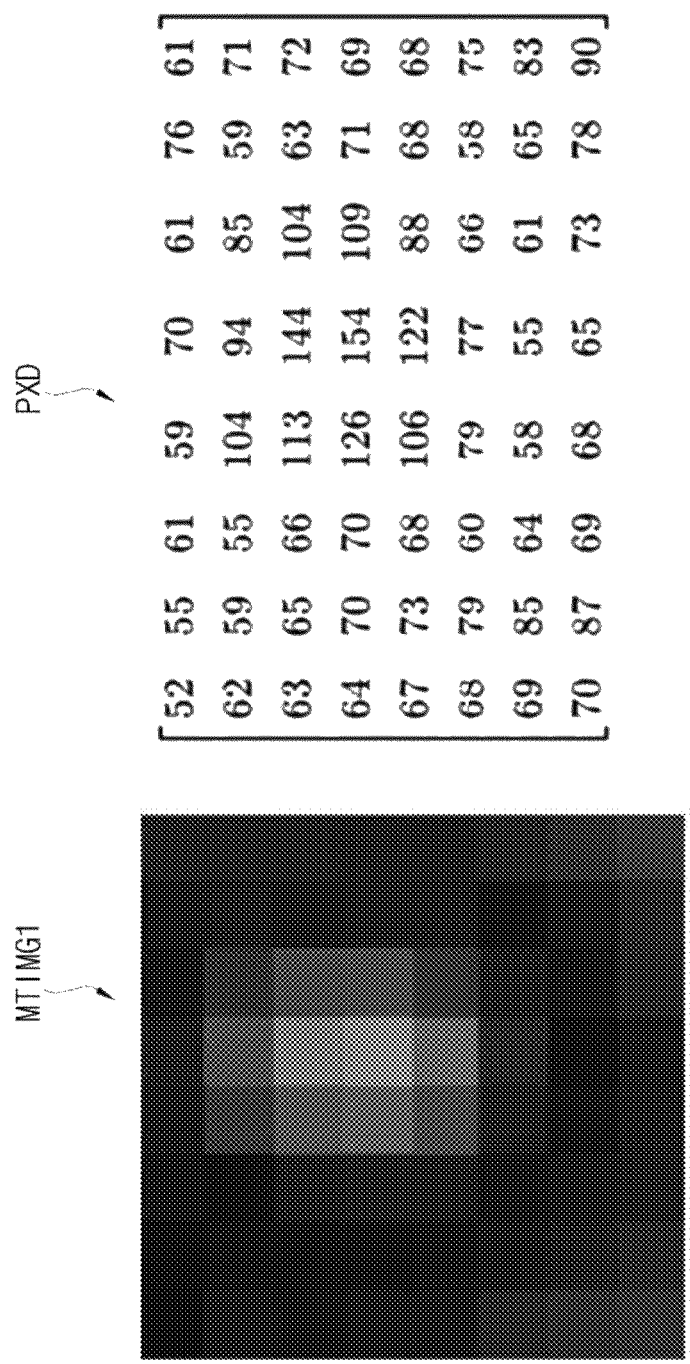
FIG. 5A is a diagram illustrating a measured TEM image and corresponding pixel data according to an exemplary embodiment of the inventive concept.

FIG. 5A is a diagram illustrating a measured TEM image and corresponding pixel data according to an exemplary embodiment of the inventive concept, and FIG. 5B is a diagram illustrating a histogram of the measured TEM image of FIG. 5A according to an exemplary embodiment of the inventive concept.

FIG. 5A shows an example of a measured TEM image MTIMG1 in a matrix form of eight rows and eight columns corresponding to a portion of a real TEM image and pixel data PXD corresponding to the measured TEM image MTIMG1. For example, each pixel value may be represented as 8-bit data and each pixel value may be one of 0 through 255.

FIG. 5B illustrates a histogram representing each pixel value v of the pixel data PXD and a number c(v) of the pixels having the pixel value v, e.g., a frequency number c(v).

FIG. 6 is a diagram illustrating a customized histogram equalization of the measured TEM image of FIG. 5A according to an exemplary embodiment of the inventive concept.

In FIG. 6, v indicates the pixel value, cdf(v) indicates an accumulated frequency count corresponding to a sum of c(0) through c(v), h(v) indicates an equalized pixel value that is obtained by performing a normal histogram equalization, and ch(v) indicates a customized pixel value that is obtained by performing a customized histogram equalization, e.g., a pixel value ch(v) of an enforced image.

The customized pixel value ch(v) may be obtained using Expression1, Expression2, and Expression3.

$$ch(v) = RND\left(\frac{cdf(v) - cdf_{min}}{(M \times N) - cdf_{min}} \times (v_{max} - CV1)\right), \quad \text{Expression 1}$$

when $cdf(v) \leq tv1$ $$ch(v) = RND\left(\frac{cdf(v) - cdf_{min}}{(M \times N) - cdf_{min}} \times v_{max}\right), \quad \text{Expression 2}$$

when $tv1 < cdf(v) < tv2$ $$ch(v) = RND\left(\frac{cdf(v) - cdf_{min}}{(M \times N) - cdf_{min}} \times (v_{max} + CV2)\right), \quad \text{Expression 3}$$

when $tv2 \leq cdf(v)$

In Expression 1, Expression2, and Expression3, ch(v) indicates the customized pixel value of the enforced image, RND( ) indicates a function of rounding off, up or down, M indicates a number of an image row, N indicates a number of an image column, cdf(v) indicate an accumulated frequency count from a pixel value of 0 to a pixel value v, $cdf_{min}$ indicates a minimum accumulated frequency count, $v_{max}$ indicates a maximum pixel value, CV1 indicates a first adjustment value, CV2 indicated a second adjustment value, tv1 indicates a first threshold frequency count, and a tv2 indicates a second threshold frequency count.

If the first adjustment value CV1 and the second adjustment value CV2 are set to zero, the equalized pixel value h(v) becomes equal to the customized pixel value ch(v) of the enforced image. The first adjustment value CV1 and the second adjustment value CV2 may be determined through a calibration process. For example, the first adjustment value CV1 and the second adjustment value CV2 may be set to be lower than about 10% of the maximum pixel value $v_{max}$. The first threshold frequency count tv1 and the second threshold frequency count tv2 may be set to a predetermined portion (e.g., 20%) of the entire pixel number M×N. The example of FIG. 6 corresponds to a case that $v_{max}$=255, CV1=25, CV2=10, tv1=10, and tv2=52.

Through such customized histogram equalization, some lower pixel values PXL may be further decreased and some higher pixel values PXH may be further increased, so as to further increase the contrast of the TEM image.

Figure 7:
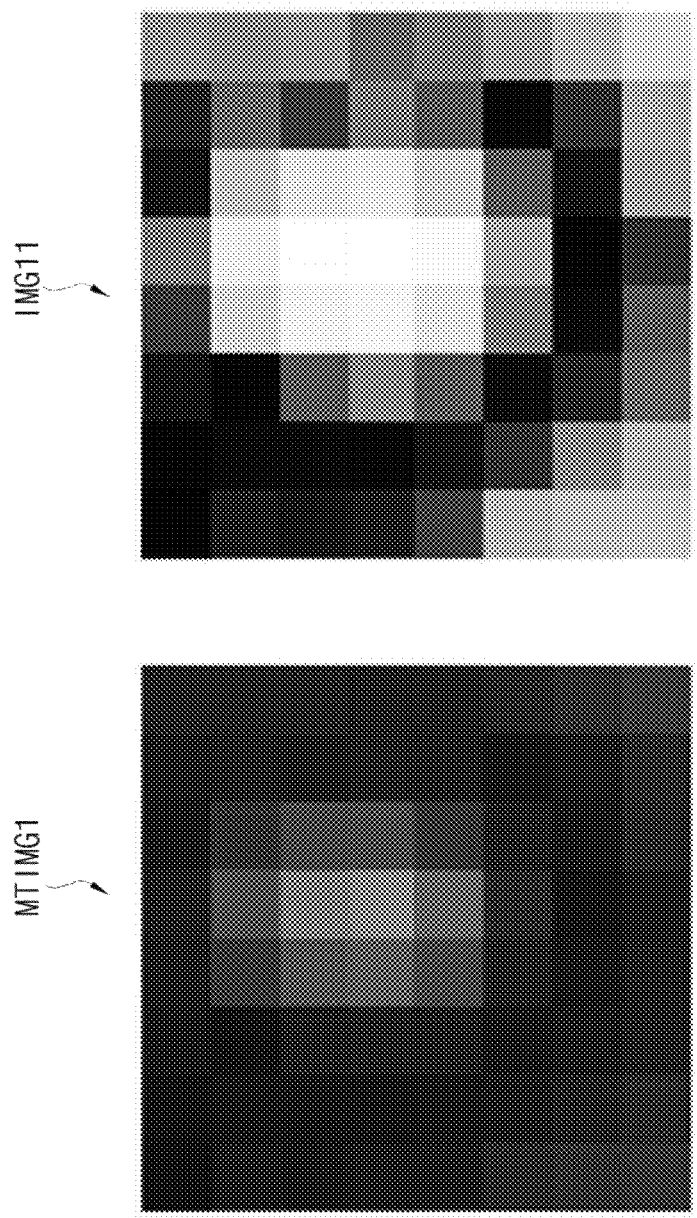
FIG. 7 is a diagram illustrating a measured TEM image and a corresponding equalized image that is obtained by performing a histogram equalization on the measured TEM image according to an exemplary embodiment of the inventive concept.
Figure 8:
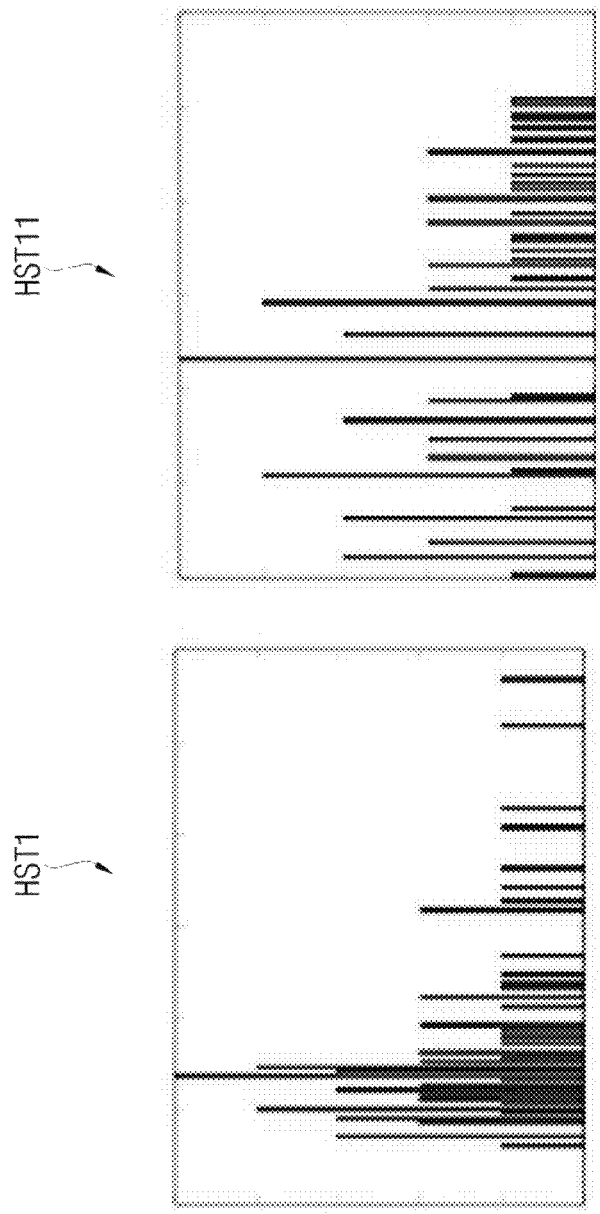
FIG. 8 is a diagram illustrating histograms of the images of FIG. 7 according to an exemplary embodiment of the inventive concept.

FIG. 7 is a diagram illustrating a measured TEM image and a corresponding equalized image that is obtained by performing a histogram equalization on the measured TEM image according to an exemplary embodiment of the inventive concept, and FIG. 8 is a diagram illustrating histograms of the images of FIG. 7 according to an exemplary embodiment of the inventive concept.

Referring to FIG. 7, the measured TEM image MTIMG1 has original pixel values v that are measured by a TEM, and the equalized image IMG11 has equalized pixel values h(v) that are obtained by performing a normal histogram equalization as described above.

Referring to FIG. 8, a histogram HST11 of the equalized image IMG11 has an increased dispersion in comparison with a histogram HST1 of the measured TEM image MTIMG1. As a result, the contrast of the equalized image IMG11 is increased in comparison with the contrast of the measured TEM image MTIMG1.

Figure 9:
FIG. 9 is a diagram illustrating a measured TEM image and a corresponding enforced image that is obtained by performing a customized histogram equalization on the measured TEM image according to an exemplary embodiment of the inventive concept.
Figure 9:
Figure 10:
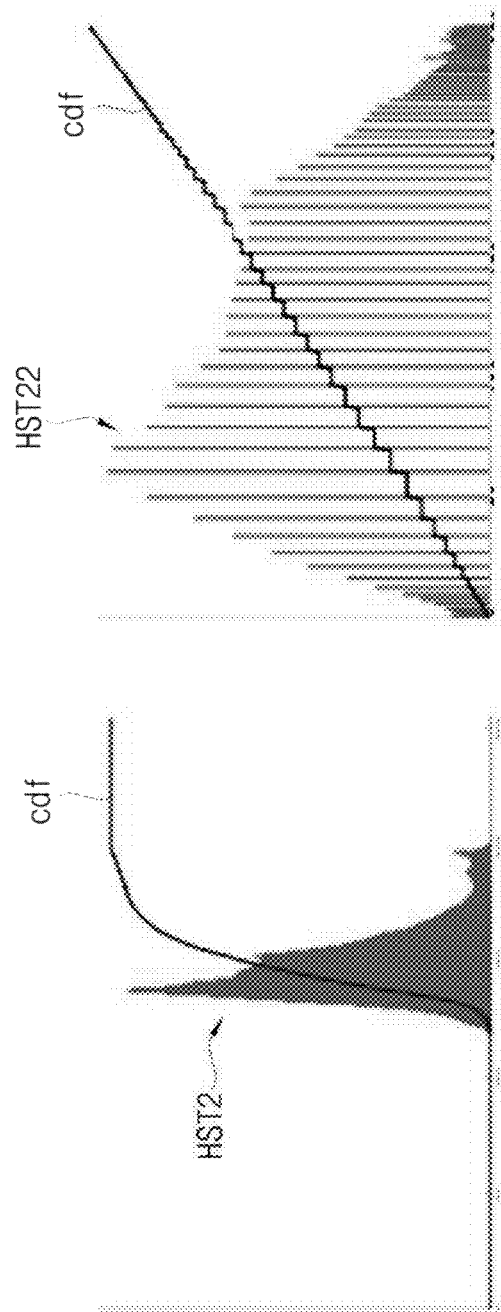
FIG. 10 is a diagram illustrating histograms of the images of FIG. 9 according to an exemplary embodiment of the inventive concept.

FIG. 9 is a diagram illustrating a measured TEM image and a corresponding enforced image that is obtained by performing a customized histogram equalization on the measured TEM image according to an exemplary embodiment of the inventive concept, and FIG. 10 is a diagram illustrating histograms of the images of FIG. 9 according to an exemplary embodiment of the inventive concept.

Referring to FIG. 9, a measured TEM image MTIMG2 has the original pixel values v that are measured by a TEM, and an enforced image IMG22 has customized pixel values ch(v) that are obtained by performing a customized histogram equalization as described above.

Referring to FIG. 10, accumulated frequency counts cdf are illustrated. A histogram HST22 of the enforced image IMG22 has an increased dispersion in comparison with a histogram HST2 of the measured TEM image MTIMG2. As a result, the contrast of the equalized image IMG22 is further increased in comparison with the contrast of the measured TEM image MTIMG2.

As described above, the customized pixel values ch(v) may be obtained by further enforcing the contrast of the equalized pixel values h(v) such that some lower pixel values are further decreased and some higher pixel values are further increased. The atom arrangement pattern may be traced efficiently based on the enforced image that includes the customized pixel values ch(v) because dark portions of the image are further darkened and bright portions of the image are further brightened in the enforced image.

Figure 11:
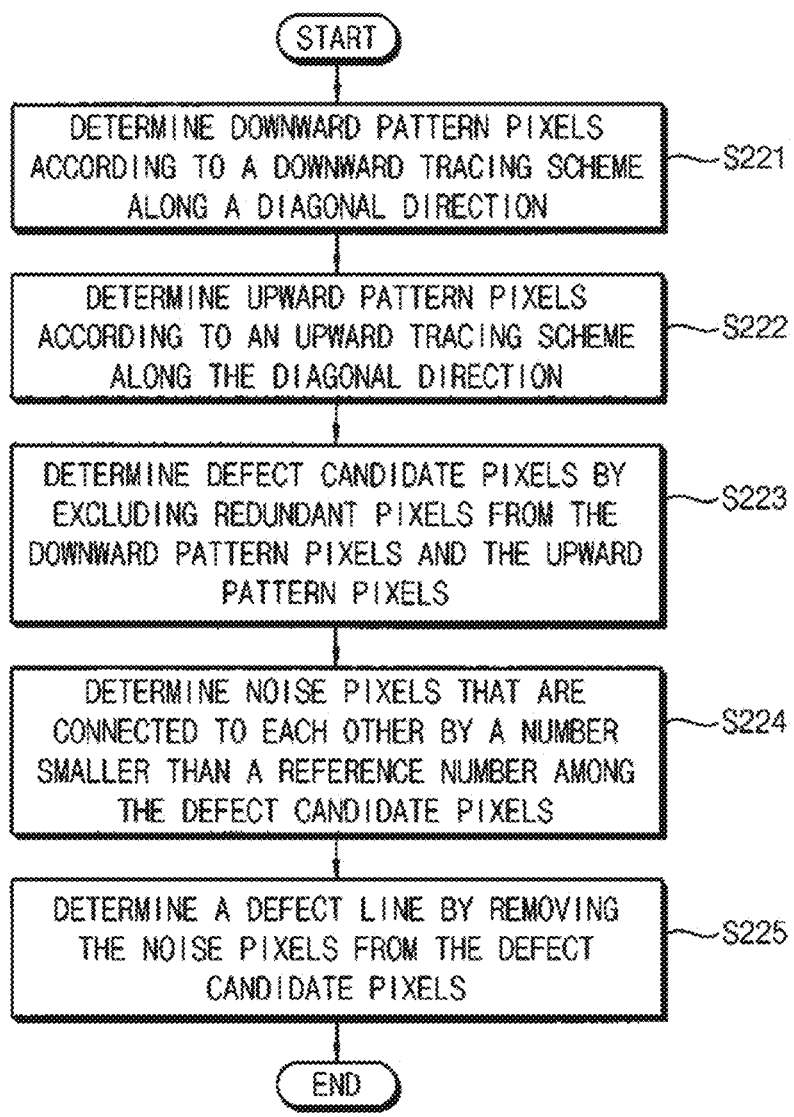
FIG. 11 is a flowchart illustrating a method of detecting a defect line according to an exemplary embodiment of the inventive concept.

FIG. 11 is a flowchart illustrating a method of detecting a defect line according to an exemplary embodiment of the inventive concept.

Referring to FIG. 11, the defect line detector 220 included in the image processor 200 of FIG. 3 may determine downward pattern pixels according to a downward tracing scheme along a diagonal direction (S221) and determine upward pattern pixels according to an upward tracing scheme along the diagonal direction (S222). The defect line detector 220 may determine defect candidate pixels by excluding redundant pixels from the downward pattern pixels and the upward pattern pixels (S223), and determine noise pixels that are connected to one another by a number smaller than a reference number among the defect candidate pixels (S224). Finally, the defect line detector 220 may determine the defect line by removing the noise pixels from the defect candidate pixels.

Hereinafter, the method of detecting the defect line based on one example measured TEM image MTIMG will be described with reference to FIGS. 12A through 12F.

FIGS. 12A, 12B, 12C, 12D, 12E, and 12F are diagrams illustrating a procedure of detecting a defect line according to an exemplary embodiment of the inventive concept.

FIG. 12A illustrates customized pixel values of an enforced image that are obtained by performing the customized histogram equalization as described above. The enforced image of FIG. 12A corresponds to a portion of an example measured TEM image MTIMG that is obtained by a TEM.

Referring to FIG. 12B, the shaded pixels corresponds to the downward pattern pixels that are determined by the downward tracing scheme. In exemplary embodiments of the inventive concept, the downward pattern pixels may be determined by a left downward tracing scheme as illustrated in FIG. 12B. According to the left downward tracing scheme, when (X, Y) is a coordinate of a P-th downward pattern pixel, a coordinate corresponding to a maximum pixel value among (X+1, Y), (X, Y−1), and (X+1, Y−1) may be determined as a coordinate of a (P+1)-th downward pattern pixel. Here, X is a row coordinate (R1~R20) of a pixel and Y is a column coordinate (C1~C20) of the pixel.

For example, when (R1, C10) is a P-th downward pattern pixel, (R2, C10) corresponding to a maximum pixel value of 115 among (R2, C10), (R1, C9), and (R2, C9) may be determined as a coordinate of a (P+1)-th downward pattern pixel. Again, when (R2, C10) is the (P+1)-th downward pattern pixel, (R2, C9) corresponding to a maximum pixel value of 81 among (R3, C10), (R2, C9), and (R3, C9) may be determined as a coordinate of a (P+2)-th downward pattern pixel. As such, the downward pattern pixels may be determined by tracing the maximum pixel values in the left-down diagonal direction until the last row is attained. A plurality of lines of the shaded pixels illustrated in FIG. 12B represent that the left downward tracing is performed respectively with respect to a plurality of seed pixels. The seed pixels may be determined based on the pixel values of the first row of the entire image and predetermined criteria.

Figure 12C:
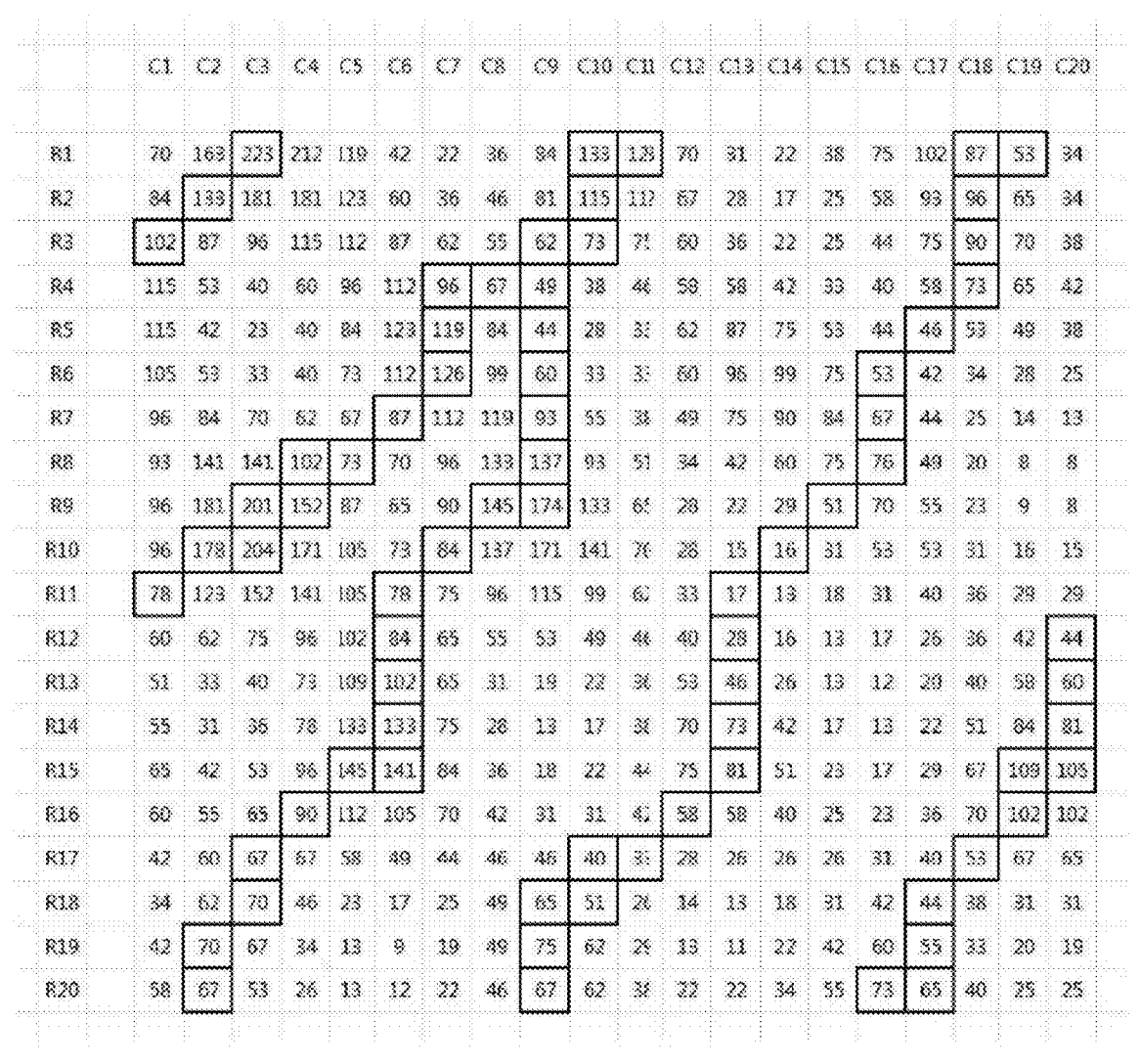

Referring to FIG. 12C, the boxed pixels corresponds to the upward pattern pixels that are determined by the upward tracing scheme. In exemplary embodiments of the inventive concept, the upward pattern pixels may be determined by a right upward tracing scheme as illustrated in FIG. 12C. According to the right upward tracing scheme, when (X, Y) is a coordinate of an S-th upward pattern pixel, a coordinate corresponding to a maximum pixel value among (X−1, Y), (X, Y+1), and (X−1, Y+1) may be determined as a coordinate of an (S+1)-th upward pattern pixel.

For example, when (R20, C2) is an S-th upward pattern pixel, (R19, C2) corresponding to a maximum pixel value of 70 among (R19, C2), (R20, C3,) and (R19, C3) may be determined as a coordinate of an (S+1)-th upward pattern pixel. Again, when (R19, C2) is the (S+1)-th upward pattern pixel, (R18, C3) corresponding to a maximum pixel value of 70 among (R18, C2), (R19, C3), and (R18, C3) may be determined as a coordinate of an (S+2)-th upward pattern pixel. As such, the upward pattern pixels may be determined by tracing the maximum pixel values in the right-up diagonal direction until the first row is attained. A plurality of lines of the boxed pixels illustrated in FIG. 12C represent that the right upward tracing is performed respectively with respect to a plurality of seed pixels. The seed pixels may be determined based on the pixel values of the last row of the entire image and predetermined criteria.

The left downward tracing scheme of determining the downward pattern pixels and the right upward tracing scheme of determining the upward pattern pixels are described with reference to FIGS. 12B and 12C, but the inventive concept is not limited thereto. In exemplary embodiments of the inventive concept, the downward pattern pixels may be determined through a right downward tracing scheme and the upward pattern pixels may be determined through a left upward tracing scheme. According to the right downward tracing scheme, when (X, Y) is a coordinate of a P-th downward pattern pixel, a coordinate corresponding to a maximum pixel value among (X+1, Y), (X, Y+1), and (X+1, Y+1) may be determined as a coordinate of a (P+1)-th downward pattern pixel. According to the left upward tracing scheme, when (X, Y) is a coordinate of an S-th upward pattern pixel, a coordinate corresponding to a maximum pixel value among (X−1, Y), (X, Y−1), and (X-1, Y−1) may be determined as a coordinate of an (S+1)-th upward pattern pixel.

Figure 12D:
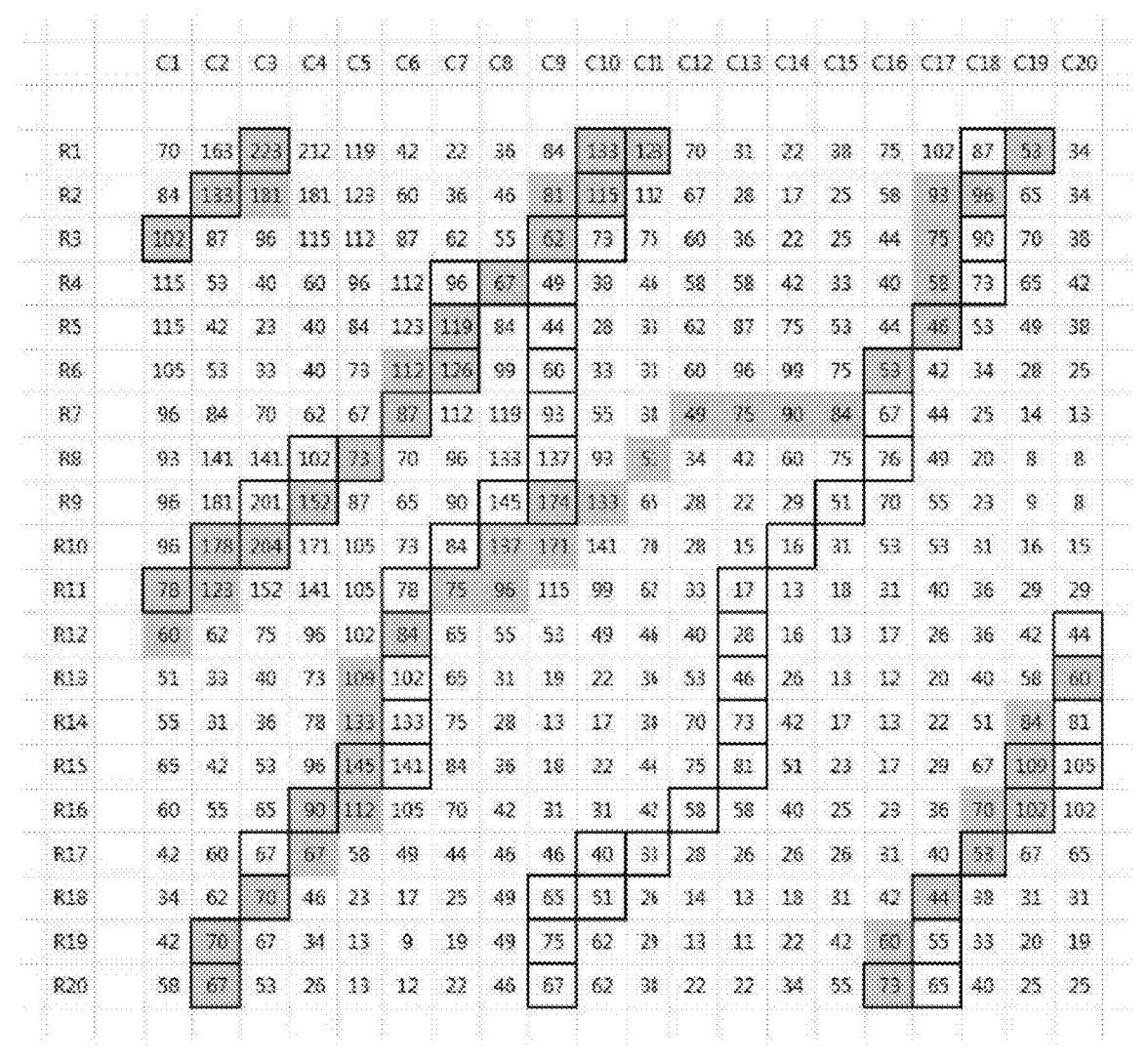

FIG. 12D illustrates both of the downward pattern pixels and the upward pattern pixels that are determined by the downward and upward tracing schemes as described with reference to FIGS. 12B and 12C. The defect candidate pixels may be determined by excluding redundant pixels from the downward pattern pixels and the upward pattern pixels. In other words, the downward pattern pixels that are not included in the upward pattern pixels and the upward pattern pixels that are not included in the downward pattern pixels may be determined as the defect candidate pixels.

Figure 12E:
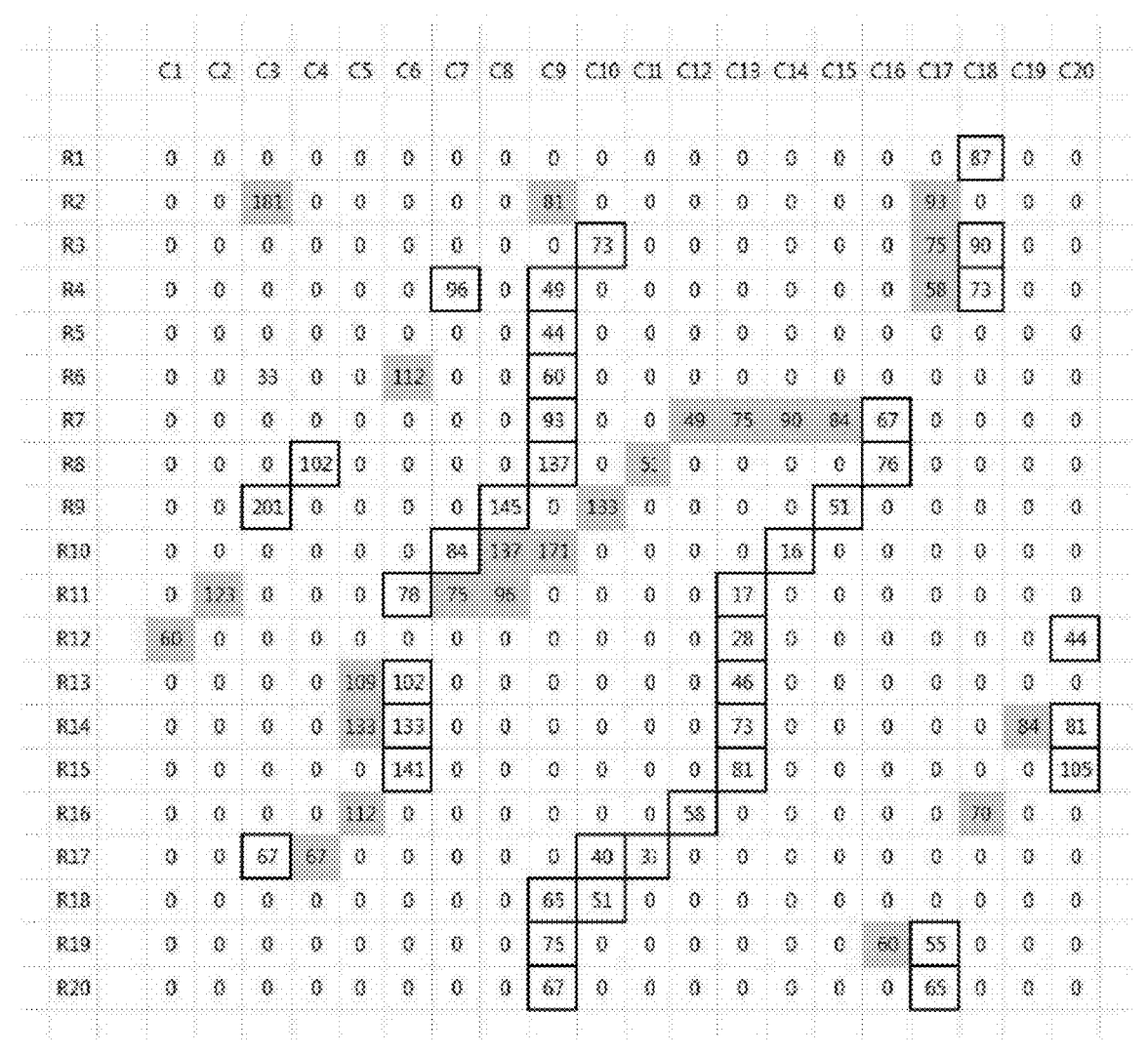

FIG. 12E illustrates the defect candidate pixels that are determined as described above. The pixel values of the pixels except the defect candidate pixels may be replaced with zero. Among the defect candidate pixels represented as the shaded pixels and the boxed pixels, the pixels that are connected to one another by a number smaller than a reference number may be determined as noise pixels.

For example, if the reference number is set to fifteen with respect to the defect candidate pixels of FIG. 12E, the defect candidate pixels may be determined as the noise pixels except the downward pattern pixels connected continuously between two end pixels of (R20, C9) and (R7, C16).

FIG. 12F illustrates defect pixels forming the defect line that are determined, as described above, by removing the noise pixels from the defect candidate pixels of FIG. 12E. The pixel values of the pixels except the defect pixels may be replaced with zero as illustrated in FIG. 12F.

The core location determinator 230 included in the image processor 200 of FIG. 3 may determine a location of an end point of the defect line as a location of a dislocation core. In exemplary embodiments of the inventive concept, the core location determinator 230 may determine the location of the dislocation core as the one end pixel of the defect line that is nearer to the center of the image among the two end pixels of the defect line. In the case of FIG. 12F, the core location determinator 230 may determine the coordinate of (R7, C16) as the location of the dislocation core.

Figure 13A:
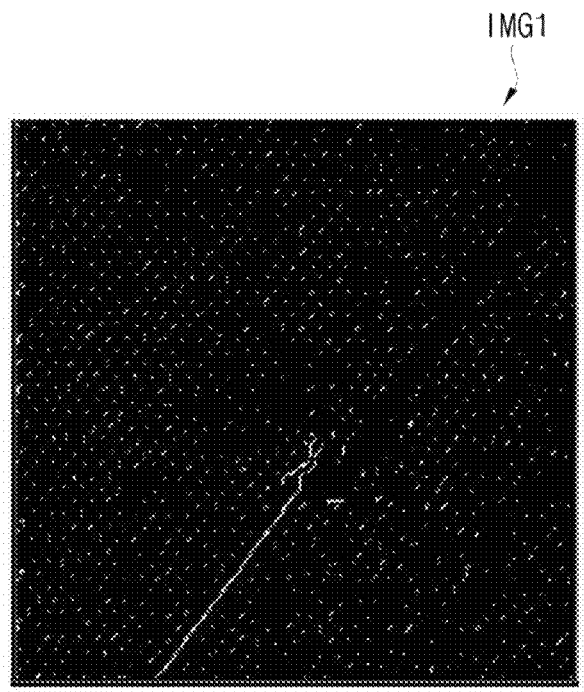
FIGS. 13A, 13B, and 13C are diagrams illustrating images according to a procedure of detecting a dislocation core according to an exemplary embodiment of the inventive concept.
Figure 13B:
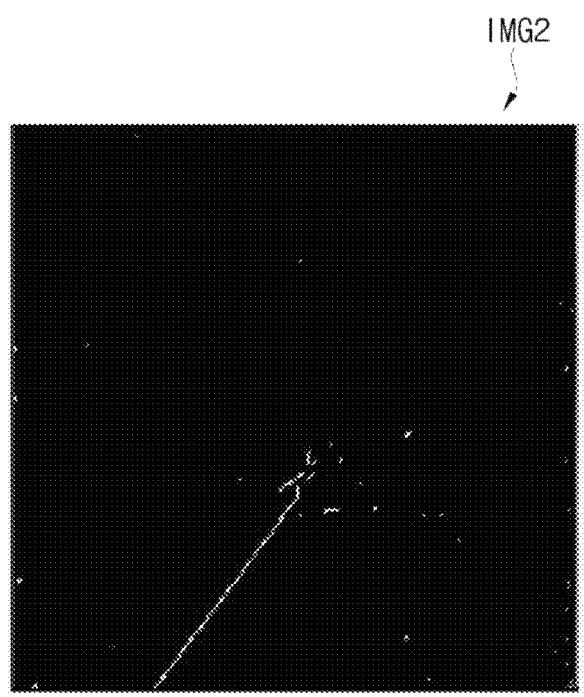
Figure 13C:
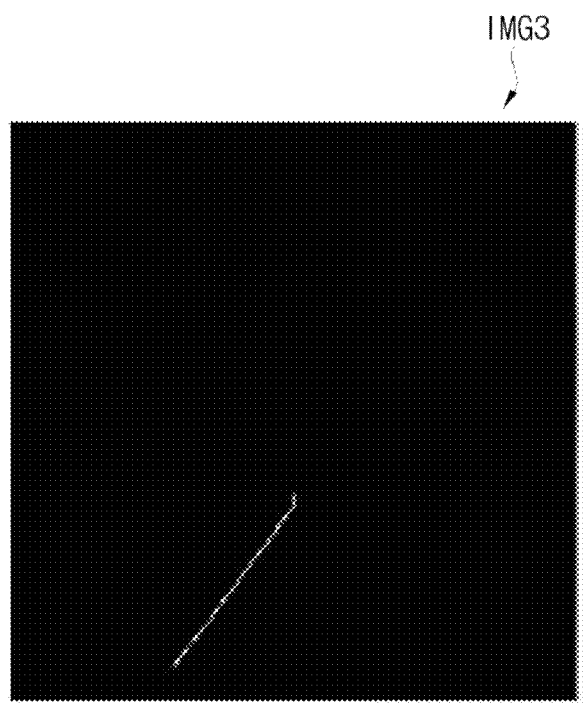

FIGS. 13A, 13B, and 13C are diagrams illustrating images according to a procedure of detecting a dislocation core according to an exemplary embodiment of the inventive concept.

FIG. 13A illustrates a first image IMG1 corresponding to the defect candidate pixels. FIG. 13B illustrates a second image IMG2 after the one or two connected pixels are filtered as noise pixels from the first image IMG1 of FIG. 13A. FIG. 13C illustrates a third image IMG3 corresponding to the defect line after further noise pixels are filtered from the second image IMG2 of FIG. 13B considering the connectivity based on the reference number.

Figure 14A:
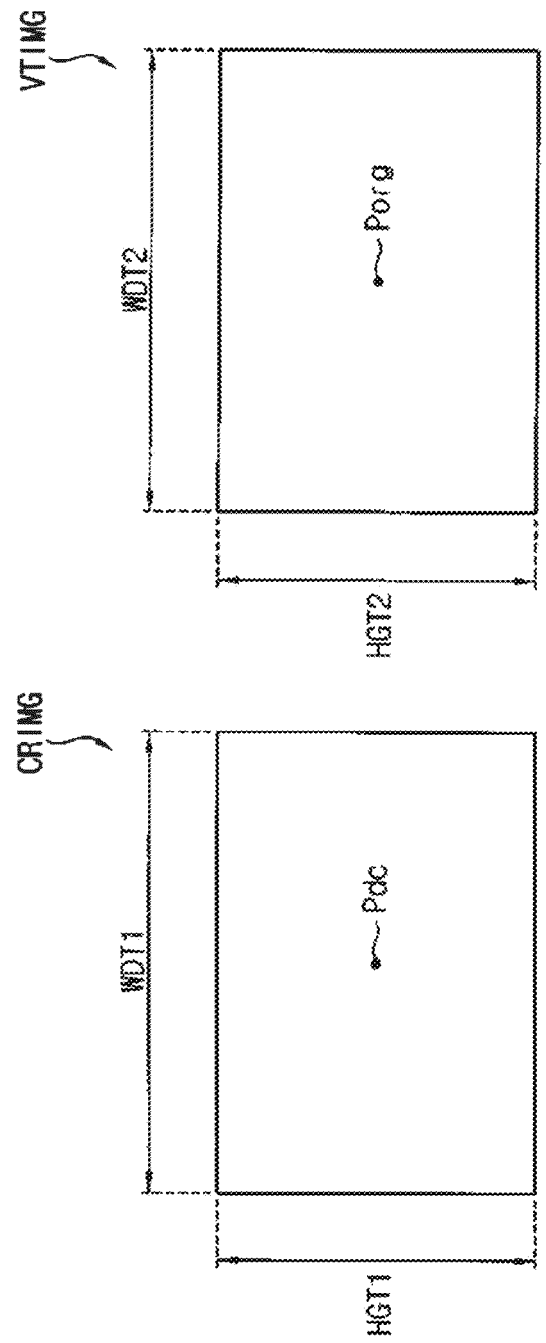
FIGS. 14A and 14B are diagrams for describing a cropped image based on a location of a dislocation core according to an exemplary embodiment of the inventive concept.
Figure 14B:
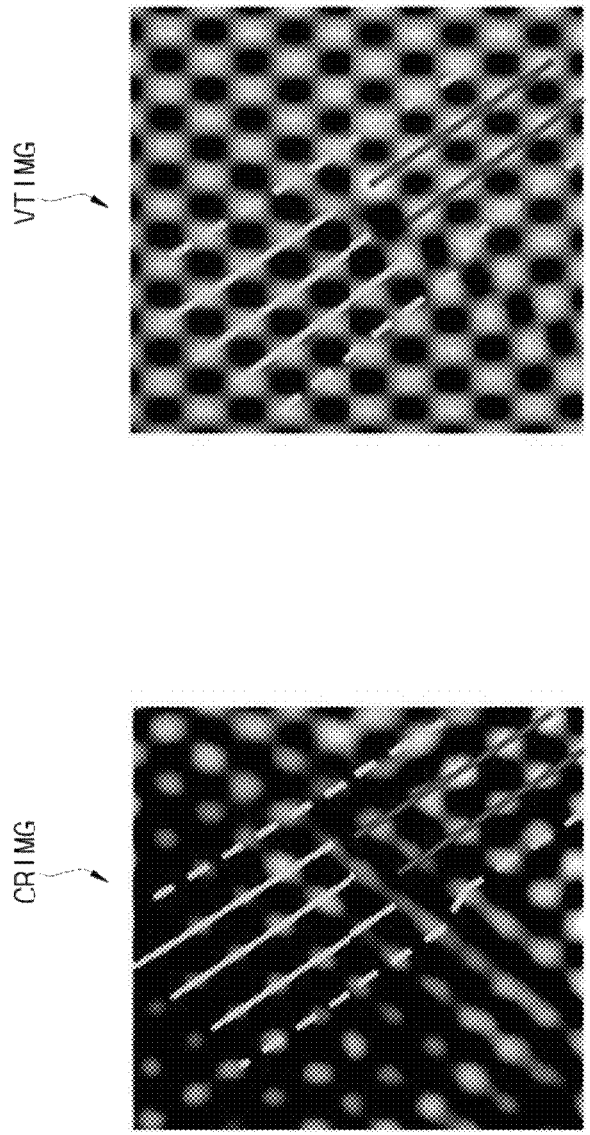

FIGS. 14A and 14B are diagrams for describing a cropped image based on a location of a dislocation core according to an exemplary embodiment of the inventive concept.

Referring to FIG. 14A, a cropped image CRIMG and each virtual TEM image VTIMG may have the same size. In other words, a row size HGT1 of the cropped image CRIMG may be equal to a row size HGT2 of the virtual TEM image VTIMG, and a column size WDT1 of the cropped image CRIMG may be equal to a column size WDT2 of the virtual TEM image VTIMG.

As described above, the cropped image CRIMG may correspond to a portion of the measured TEM image or a portion of a processed image of the measured TEM image. The cropped image CRIMG may have a predetermined size and centered on a location Pdc of the dislocation core. As will be described with reference to FIGS. 16A and 16B, while each virtual TEM image is generated, atoms may be arranged such that each dislocation core Porg corresponding to each three-dimensional structural defect may be disposed at a center of an incident plane.

As such, the location Pdc of the dislocation core of the measured TEM image may be matched with the location Porg of the dislocation core of each virtual TEM image VTIMG to compare the measured TEM image and the plurality of virtual TEM images. The calculation amount for image matching may be decreased significantly by matching the locations of the dislocation cores and the sizes of the compared images.

Figure 15A:
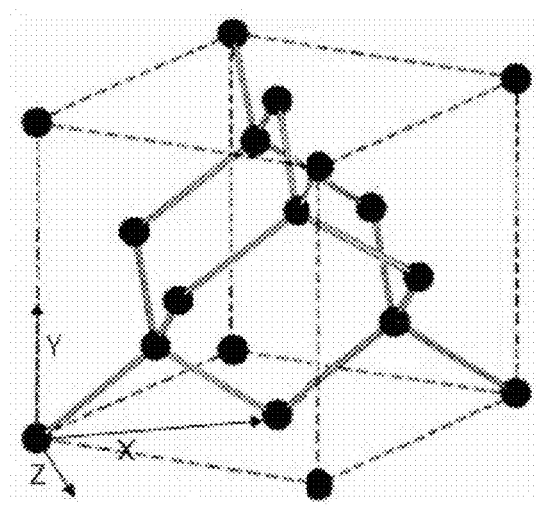
FIGS. 15A and 15B are diagrams illustrating a crystal structure and an atom arrangement direction according to an exemplary embodiment of the inventive concept.
Figure 15B:
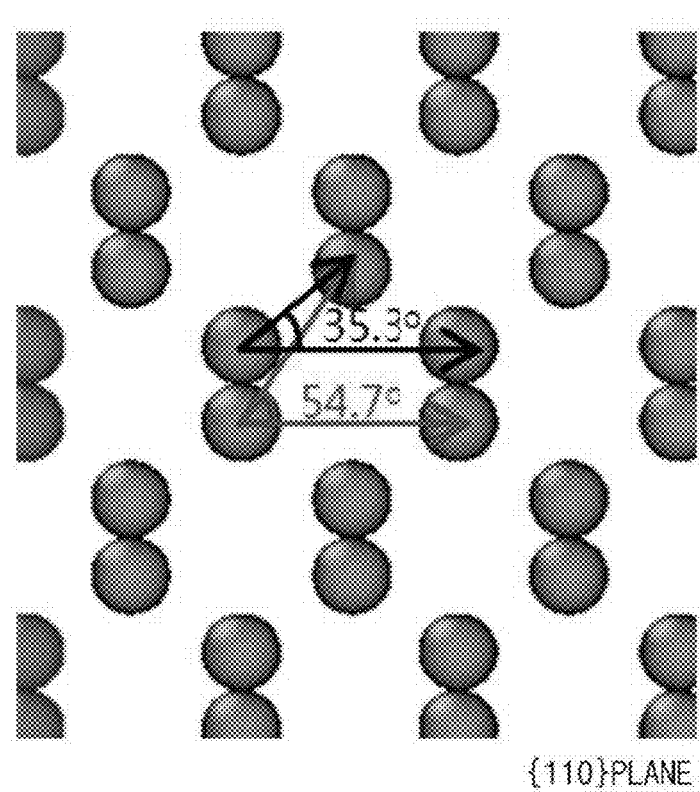

FIGS. 15A and 15B are diagrams illustrating a crystal structure and an atom arrangement direction according to an exemplary embodiment of the inventive concept.

For example, a TEM image used in a semiconductor process analysis may be captured with respect to {110} plane. In this case, an X axis is along a <110> direction and a Y axis is along a <001> direction. Silicon (Si) has a cubic diamond lattice structure as illustrated in FIG. 15A and regular atom arrangement is observed when the X axis is aligned to the <110> direction and the Y axis is aligned to the <001> direction as illustrated in FIG. 15B. The angle between the <112> direction and the <110> direction of the X axis is about 54.7 degrees.

The image tracing scheme in the lattice direction as described with reference to FIGS. 11 through 12F may be efficient in inspecting the periodicity in directions of 54.7 and/or 35.3 degrees, which is the characteristic arrangement of the Si lattice structure.

The surrounding portion of the dislocation core is characterized by the fact that the lattice periodicity is locally dislocated. To cause a dislocation, a portion of the atom arrangement has to be translated and such translation is generally represented as a Burgers vector. The Burgers vector representing the most stable translation, e.g., a minimum lattice translation, is ⅙<122>. In other words, the most efficient method of finding the dislocation core is to inspect the periodicity in the <112> direction which is a diagonal direction of 54.7 degree with respect to the X axis in a typical semiconductor process analysis.

Figure 16A:
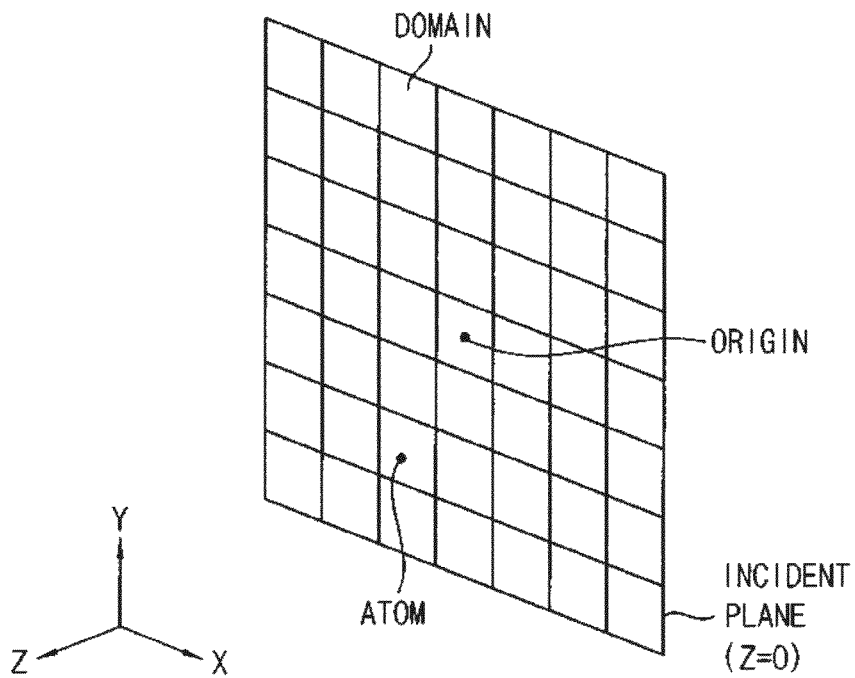
FIGS. 16A and 16B are diagrams for describing a method of generating a virtual TEM image according to an exemplary embodiment of the inventive concept.
Figure 16B:
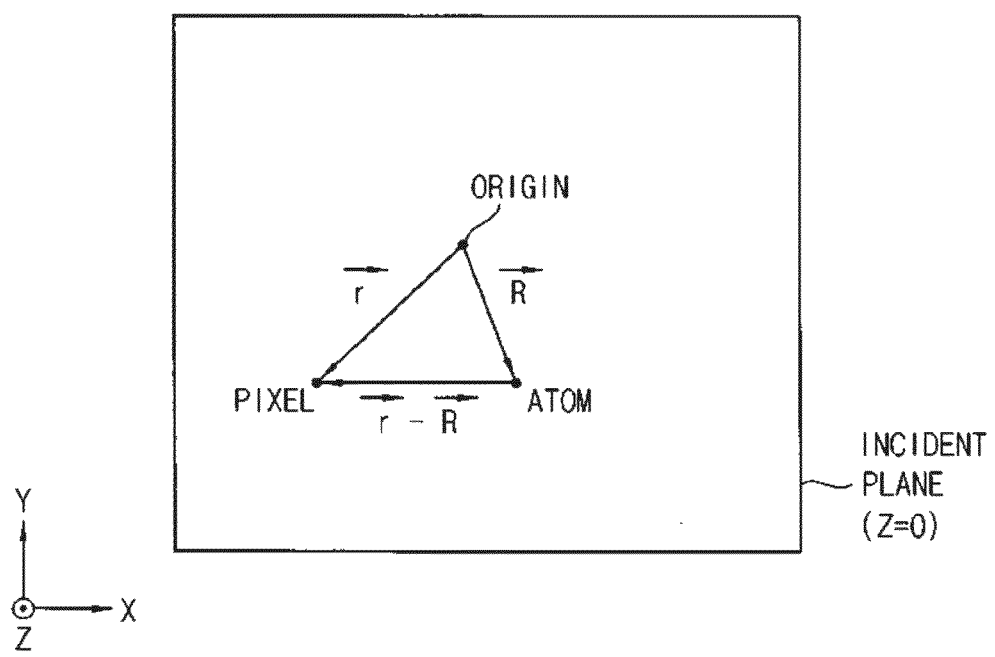

FIGS. 16A and 16B are diagrams for describing a method of generating a virtual TEM image according to an exemplary embodiment of the inventive concept.

Referring to 16A, an incident plane of an electron beam or an electron wave by a TEM may be divided into a plurality of domains. Each three-dimensional structural defect may be set as an arrangement of atoms disposed at corresponding locations on the incident plane. FIG. 16A illustrates one atom in a domain for convenience of illustration, and each atom may be arranged in a domain for all domains in the incident plane. The conventional multi-slice scheme may take a long time and thus an approximation method may be required to simulate a specimen of about several nanometers to several hundred nanometers. The calculation amount of the multi-slice scheme may be very large because the propagation of the electro wave is modeled such that the electron wave penetrates a plurality of thin slices.

According to an exemplary embodiment of the inventive concept, all secondary scattering during the propagation of the electron wave may be neglected and a virtual TEM image may be simulated using only an intensity of a final light that penetrates the domains.

In the approximation according to an exemplary embodiment of the inventive concept, when a propagation direction of a light is a Z direction, atomic potential depending on an atom position $\vec{R}$ in each domain may be considered once in the two-dimensional Z=0 plane. Whereas the light penetrates multiple slices in the conventional method, the light penetrates the Z=0 plane once in the exemplary embodiments of the inventive concept and thus all secondary scattering may be neglected. The light penetrating each domain may be simulated as being scattered by the atomic potential in each domain including the atom at $\vec{R}$.

The propagating light may be assumed to be a monochromatic beam, e.g., a sinusoidal plane wave that has a variation depending on a wavelength. In addition, it is assumed that there is no temporal phase variation because the intensity of the propagating sinusoidal wave is time-averaged. Through such assumptions, the intensity or the irradiation of the light may be represented as an amount of a time-averaged radiated energy flux, which corresponds to a real part of a Poynting vector as Expression4.

$$\vec{S} = \frac{1}{\mu_0}\vec{E} \times \vec{B} \qquad \text{Expression 4}$$

-continued $$\langle \vec{S} \rangle = \text{Re}\left(\frac{1}{2}\vec{S}_m\right) = \frac{1}{2\eta}|Em|^2$$

The distribution of the light intensity may be represented as attenuated intensity due to scattering by the atomic potential in each domain as Expression5.

$$I(r, z) = \frac{|E(r, x)|^2}{2\eta} = I_0 \left(\frac{w_0}{w(z)}\right)^2 \cdot \exp\left(\frac{-2r^2}{w(z)^2}\right) \qquad \text{Expression 5}$$

In Expression5, $r = |\vec{r} - \vec{R}|$, $\vec{r}$ indicates a position vector of a pixel in a virtual TEM image and $\vec{R}$ is a position vector of an atom.

If z is fixed to zero with respect to the propagation direction of the light, the intensity may be independent of z and thus may be simplified as Expression6.

$$I(\vec{r}, \vec{R}) = A \cdot \exp\left(\frac{-|\vec{r} - \vec{R}|^2}{B}\right) \qquad \text{Expression 6}$$

In Expression6, A is a first parameter, and B is a second parameter. The first parameter A and the second parameter B may be determined through a tuning process such that each virtual TEM image approaches a real TEM image.

As a result, pixel values of each virtual TEM image corresponding to each three-dimensional structural defect may be calculated using Expression7.

$$P(\vec{r}) = \sum_R I(\vec{r}, \vec{R}) = \sum_R A \cdot \exp\left(\frac{-|\vec{r} - \vec{R}|^2}{B}\right) \qquad \text{Expression 7}$$

In Expression7, $\vec{r}$ indicates a position vector of a pixel on each virtual TEM image, $\vec{R}$ indicates a position vector of an atom in each domain, $P(\vec{r})$ indicates a pixel value at $\vec{r}$, A indicates the first parameter, and B indicates the second parameter.

Figure 17:
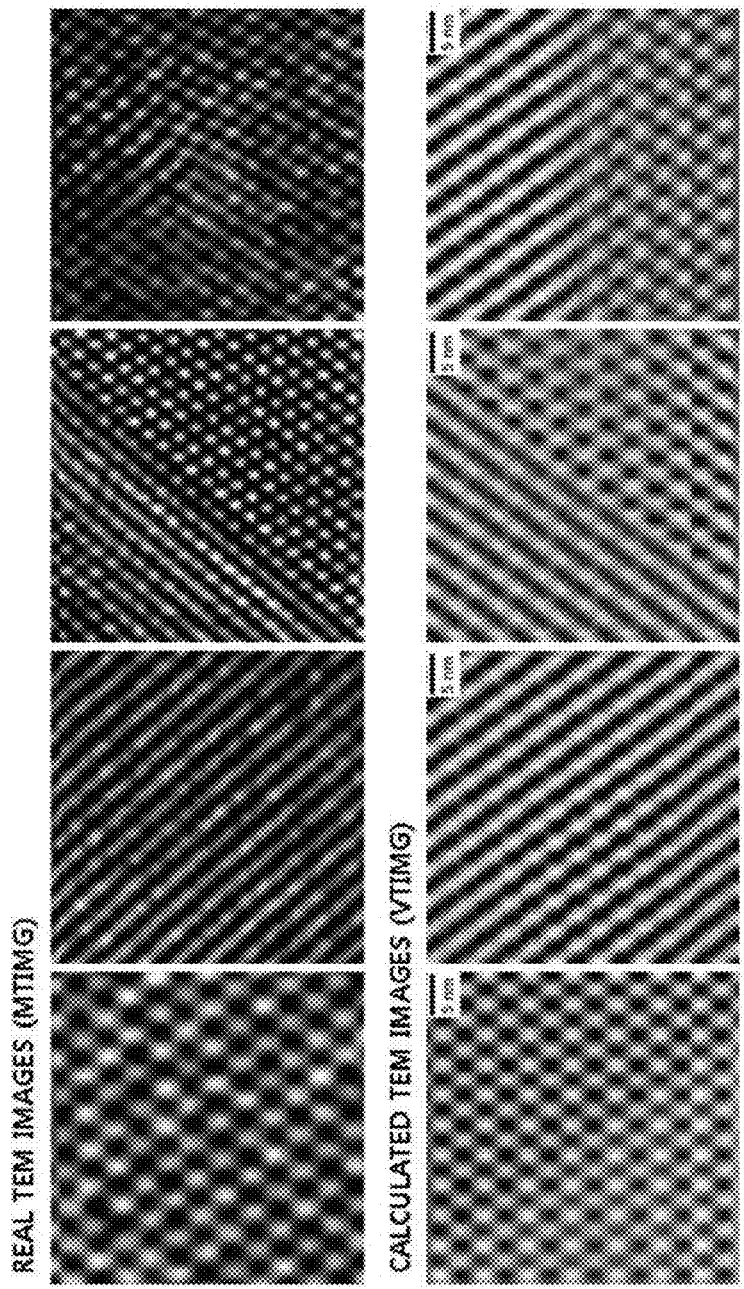
FIG. 17 is a diagram illustrating measured TEM images and corresponding virtual TEM images according to an exemplary embodiment of the inventive concept.

FIG. 17 is a diagram illustrating measured TEM images and corresponding virtual TEM images according to an exemplary embodiment of the inventive concept.

FIG. 17 illustrates four examples of a real TEM image, e.g., the measured TEM image MTIMG, and a corresponding calculated TEM image, e.g., the virtual TEM image VTIMG.

The preferred slip system of the Si or SiGe lattice structure may be defined as a {111} plane and <110> direction, where a slip system is defined as a plane and a direction. There exist twelve slip systems due to a cubic symmetry.

Two types of the location of the dislocation core may exist due to a local symmetry of a {101} plane, e.g., a glide type and a shuffle type. The Burgers vector of the dislocation is made up of two components, a screw and an edge, and eight combinations are possible when a Volterra cylinder is applied to implement the two components. The kinds of the dislocation may be defined by an angle between the Burgers vector and a dislocation line corresponding to the above-described defect line. The angle may be 0, 30, 60, and 90 degrees and each kind of dislocation may be dissociated to a partial dislocation of angles of 0, 30, 60, 90, 120, and 150 degrees that is more stable than the perfect dislocation. Thus the ten types of the dislocation may be considered, the four types of the perfect dislocation of 0, 30, 60, and 90 degrees and the six types of the partial dislocation of 0, 30, 60, 90, 120, and 150 degrees.

Considering all the above cases, the number of the three-dimensional structural defects may be 12*2*8*10=1920 in the case of a cubic diamond lattice structure.

Figure 18:
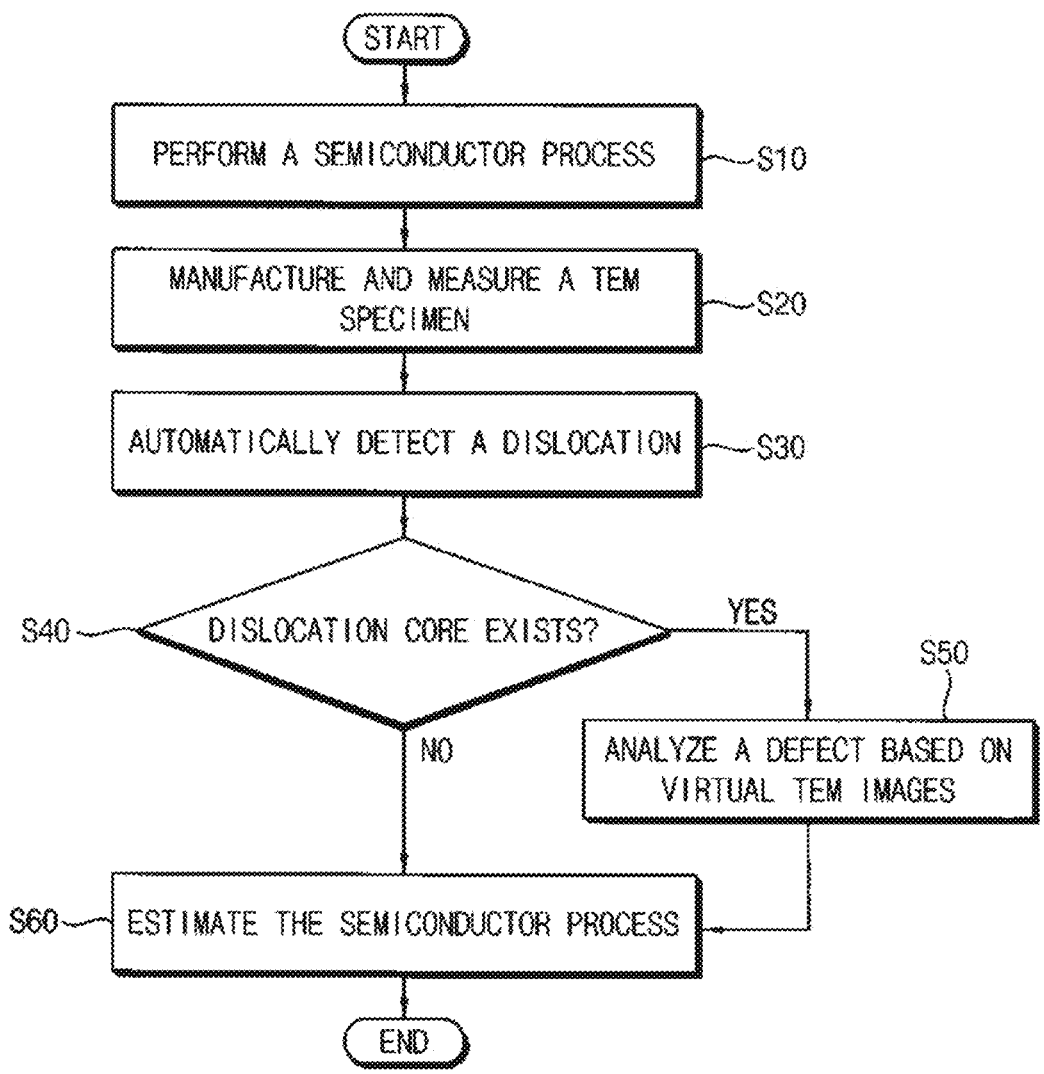
FIG. 18 is a flowchart illustrating a method of improving a semiconductor process according to an exemplary embodiment of the inventive concept.

FIG. 18 is a flowchart illustrating a method of improving a semiconductor process according to an exemplary embodiment of the inventive concept.

Referring to FIG. 18, a semiconductor process such as epitaxial growth, etching, deposition etc. is performed (S10), and then a TEM specimen is manufactured and a TEM image of the TEM specimen is measured using a TEM (S20).

According to an exemplary embodiment of the inventive concept, a dislocation in the crystal structure of the TEM specimen is automatically detected (S30). As described above, an enforced image having an enhanced contrast may be provided based on the measured TEM image and the atom arrangement pattern may be traced in the lattice direction based on the enforced image to detect the defect line including the defect pixels that is deviated from a periodicity of the atomic arrangement pattern. The end point of the defect line may be determined as the location of the dislocation core. Such data processing may be performed by hardware, software, or a combination of hardware and software. Human errors of empirical analysis may thus be prevented through such automation of image processing and defect detection.

When the dislocation core does not exist (S40: NO), the semiconductor process is estimated (S60). When the dislocation core exists (S40: YES), the analysis is performed based on the virtual TEM images (S50) and the semiconductor process is estimated based on the analysis result (S60). In exemplary embodiments of the inventive concept, a stress effect analysis may be performed by associating the analysis based on the virtual TEM images with a technology computer aided design (TCAD) simulation.

As described above, the analysis based on the virtual TEM images may be performed by providing a plurality of virtual TEM images corresponding to a plurality of three-dimensional structural defects of the crystal structure and determining a defect type of the measured TEM image by comparing the measured TEM image with the plurality of virtual TEM images based on the structural defect information.

As such, the semiconductor processes may be efficiently estimated and improved, by analyzing the three-dimensional structural defect through reverse engineering using the virtual TEM images.

Figure 19:
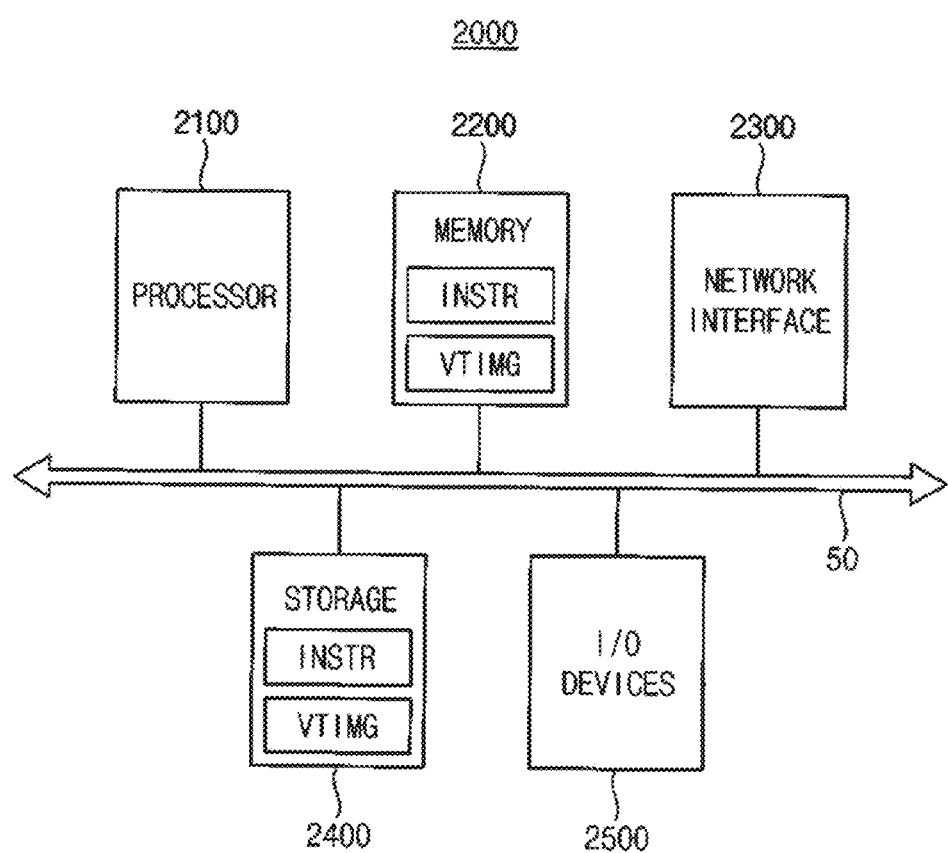
FIG. 19 is a block diagram illustrating a computing system according to an exemplary embodiment of the inventive concept.

FIG. 19 is a block diagram illustrating a computing system according to an exemplary embodiment of the inventive concept.

Referring to FIG. 19, a computing system may include a processor 2100, a memory device 2200, a network interface device 2300, a storage device 2400, input/output devices 2500, and an interconnect device 50 such as a system bus electrically connecting the components.

The processor 2100 may include one or more general-purpose processing devices such as a microprocessor, central processing unit, or the like. More particularly, the processor 2100 may be a complex instruction set computer (CISC) microprocessor, reduced instruction set computer (RISC) microprocessor, very long instruction word (VLIW) microprocessor, a processor implementing other instruction sets, or processors implementing a combination of instruction sets.

The processor 2100 may also be one or more special-purpose processing devices such as an application specific integrated circuit (ASIC), a field programmable gate array (FPGA), a digital signal processor (DSP), network processor, or the like. The processor 2100 is configured to execute instructions INSTR for performing the operations and/or processes as described above.

The instructions INSTR for performing the operations and/or processes of the crystal defect analysis as described above may be loaded to the memory device 2200 so as to be rapidly provided to the processor 2100. Additionally, the above-described virtual TEM images VTIMG may be loaded simultaneously or sequentially to the memory device 2200 so as to be rapidly provided to the processor 2100. The memory device 2200 may be implemented with a memory having a rapid operation speed such as dynamic random access memory (DRAM), static random access memory (SRAM), or the like.

The storage device 2400 may include a computer-readable storage medium in which is stored one or more sets of instructions INSTR (e.g., software) embodying any one or more of the methodologies or functions described above and the virtual TEM images VTIMG. The instructions INSTR and the virtual TEM images VTIMG may also reside, completely or at least partially, within the memory device 2200 and/or within the processor 2100 during execution thereof by the computing system 2000. In addition, the instructions INSTR and the virtual TEM images VTIMG may further be transmitted or received over a network via the network interface device 2300.

The storage device 2400 may be implemented with electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM) or the like.

The network interface device 2300 may support communication with external devices. The network interface device 2300 may be implemented with a wireless communication interface, a wired communication interface, or a combination thereof. The input/output devices 2500 may include a display device, a touchscreen device, a keyboard, a mouse, a speaker, a microphone, or the like.

Some portions of the above-described operations and/or processes may be represented in terms of algorithms and symbolic representations of operations on data bits within a computer memory.

As will be appreciated by one skilled in the art, exemplary embodiments of the inventive concept may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

As described above, the system and method of analyzing the crystal defects according to exemplary embodiments of inventive concept may prevent human errors of empirical analysis, and efficiently estimate and improve semiconductor processes, by analyzing three-dimensional structural defects through automation of image processing and defect detection as well as reverse engineering using the virtual TEM images.

The inventive concept may be applied to any semiconductor devices and semiconductor manufacturing processes. For example, the inventive concept may be applied to devices and systems such as be a memory card, a solid state drive (SSD), an embedded multimedia card (eMMC), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc. and the manufacturing processes thereof.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A system analyzing a crystal defect, comprising:
   an image processor configured to process a measured transmission electron microscope (TEM) image that is provided by capturing an image of a specimen having a crystal structure, to provide structural defect information of the specimen;
   an image generator configured to generate a plurality of virtual TEM images corresponding to a plurality of three-dimensional structural defects of the crystal structure; where each virtual TEM image is formed from a plurality pixels representing atoms of the crystal structure disposed on an incident plane having a first atomic arrangement pattern where at least one of the pixels is deviated from a periodicity of the first atomic arrangement pattern to generate the corresponding three-dimensional structure defect; and
   a comparator configured to compare the measured TEM image with the plurality of virtual TEM images using the structural defect information to determine a defect type of the measured TEM image.

2. The system of claim 1, wherein the image processor includes:
   a pre-processor configured to generate an enforced image by increasing a contrast of the measured TEM image;
   a defect line detector configured to trace a second atomic arrangement pattern in a lattice direction using the enforced image to detect a defect line including defect pixels that are deviated from a periodicity of the second atomic arrangement pattern;
   a core location determinator configured to determine a location of an end point of the defect line as a location of a dislocation core; and
   an image cropper configured to provide a cropped image having a predetermined size and centered on the location of the dislocation core, wherein the cropped image corresponds to a portion of the measured TEM image or a portion of the enforced image.

3. The system of claim 2, wherein the pre-processor is configured to perform a customized histogram equalization based on the following equations to provide the enforced image, $$ch(v) = RND\left(\frac{cdf(v) - cdf_{min}}{(M \times N) - cdf_{min}} \times (v_{max} - CV1)\right),$$
when $cdf(v) \leq tv1$ $$ch(v) = RND\left(\frac{cdf(v) - cdf_{min}}{(M \times N) - cdf_{min}} \times v_{max}\right),$$
when $tv1 < cdf(v) < tv2$ $$ch(v) = RND\left(\frac{cdf(v) - cdf_{min}}{(M \times N) - cdf_{min}} \times (v_{max} + CV2)\right),$$
when $tv2 \leq cdf(v)$ where ch(v) is a customized pixel value of the enforced image, RND( ) is a function of rounding off, up or down, M is a number of an image row, N is a number of an image column, cdf(v) is an accumulated frequency count from a pixel value of 0 to a pixel value v, $cdf_{min}$ is a minimum accumulated frequency count, $v_{max}$ is a maximum pixel value, CV1 is a first adjustment value, CV2 is a second adjustment value, tv1 is a first threshold frequency count, and tv2 is a second threshold frequency count.

4. The system of claim 2, wherein the defect line detector is configured to:
   determine downward pattern pixels according to a downward tracing scheme along a diagonal direction;
   determine upward pattern pixels according to an upward tracing scheme along the diagonal direction;
   determine defect candidate pixels by excluding redundant pixels from the downward pattern pixels and the upward pattern pixels;
   determine, as noise pixels among the defect candidate pixels, the downward pattern pixels or the upward pattern pixels that are connected to one another by a number smaller than a reference number; and
   determine the defect line by removing the noise pixels from the defect candidate pixels.

5. The system of claim 1, wherein the image generator is configured to:
   divide the incident plane of an electron wave into a plurality of domains;
   set each of the plurality of three-dimensional structural defects as an arrangement of atoms disposed at corresponding locations on the incident plane; and
   calculate pixel values of each of the plurality of virtual TEM images corresponding to one of the plurality of three-dimensional structural defects using the following equation, $$P(\vec{r}) = \sum_R I(\vec{r}, \vec{R}) = \sum_R A \cdot \exp\left(\frac{-|\vec{r} - \vec{R}|^2}{B}\right)$$

were $\vec{r}$ is a position vector of a pixel on each virtual TEM image, $\vec{R}$ is a position vector of an atom in each domain, $P(\vec{r})$ is a pixel value at $\vec{r}$, A is a first parameter, and B is a second parameter.

6. The system of claim 1, wherein the comparator is configured to match a location of a dislocation core of the measured TEM image with locations of dislocation cores of the plurality of virtual TEM images to compare the measured TEM image with the plurality of virtual TEM images.

7. A method of analyzing a crystal defect, comprising:
capturing an image of a specimen having a crystal structure to generate a measured transmission electronic microscope (TEM) image;
processing the measured TEM image to generate structural defect information of the specimen;
generating a plurality of virtual TEM images corresponding to a plurality of three-dimensional structural defects of the crystal structure, where each virtual TEM image is formed from a plurality pixels representing atoms of the crystal structure disposed on an incident plane having a first atomic arrangement pattern where at least one of the pixels is deviated from a periodicity of the first atomic arrangement pattern to generate the corresponding three-dimensional structural defect; and
determining a defect type of the measured TEM image by comparing the measured TEM image with the plurality of virtual TEM images using the structural defect information.

8. The method of claim 7, wherein the processing the measured TEM image includes:
determining a location of a dislocation core on the measured TEM image.

9. The method of claim 8, wherein determining the defect type of the measured TEM image includes:
matching the location of the dislocation core of the measured TEM image with locations of dislocation cores of the plurality of virtual TEM images to compare the measured TEM image with the plurality of virtual TEM images.

10. The method of claim 7, wherein processing the measured TEM image includes:
generating an enforced image by increasing a contrast of the measured TEM image;
tracing a second atomic arrangement pattern in a lattice direction using the enforced image to detect a defect line including defect pixels that are deviated from a periodicity of the second atomic arrangement pattern; and
determining a location of an end point of the defect line as a location of a dislocation core.

11. The method of claim 10, wherein providing the enforced image includes:
performing a customized histogram equalization based on the following equations to provide the enforced image, $$ch(v) = RND\left(\frac{cdf(v) - cdf_{min}}{(M \times N) - cdf_{min}} \times (v_{max} - CV1)\right),$$
when $cdf(v) \le tv1$ $$ch(v) = RND\left(\frac{cdf(v) - cdf_{min}}{(M \times N) - cdf_{min}} \times v_{max}\right),$$
when $tv1 < cdf(v) < tv2$ $$ch(v) = RND\left(\frac{cdf(v) - cdf_{min}}{(M \times N) - cdf_{min}} \times (v_{max} + CV2)\right),$$
when $tv2 \le cdf(v)$ where ch(v) is a customized pixel value of the enforced image, RND( ) is a function of rounding off, up or down, M is a number of an image row, N is a number of an image column, cdf(v) is an accumulated frequency count from a pixel value of 0 to a pixel value v, $cdf_{min}$ is a minimum accumulated frequency count, $v_{max}$ is a maximum pixel value, CV1 is a first adjustment value, CV2 is a second adjustment value, tv1 is a first threshold frequency count, and tv2 is a second threshold frequency count.

12. The method of claim 10, wherein detecting the defect line includes:
determining downward pattern pixels according to a downward tracing scheme along a diagonal direction;
determining upward pattern pixels according to an upward tracing scheme along the diagonal direction;
determining defect candidate pixels by excluding redundant pixels from the downward pattern pixels and the upward pattern pixels;
determining, as noise pixels among the defect candidate pixels, the downward pattern pixels or the upward pattern pixels that are connected to one another by a number smaller than a reference number; and
determining the defect line by removing the noise pixels from the defect candidate pixels.

13. The method of claim 12, wherein the downward tracing scheme is a left downward tracing scheme such that when (X, Y) is a coordinate of a P-th downward pattern pixel where X is a row coordinate and Y is a column coordinate, a coordinate corresponding to a maximum pixel value among (X+1, Y), (X, Y−1), and (X+1, Y−1) is determined as a coordinate of a (P+1)-th downward pattern pixel, and
wherein the upward tracing scheme is a right upward tracing scheme such that when (X, Y) is a coordinate of an S-th upward pattern pixel, a coordinate corresponding to a maximum pixel value among (X−1, Y), (X, Y+1), and (X−1, Y+1) is determined as a coordinate of an (S+1)-th upward pattern pixel.

14. The method of claim 12, wherein the downward tracing scheme is a right downward tracing scheme such that when (X, Y) is a coordinate of a P-th downward pattern pixel where X is a row coordinate and Y is a column coordinate, a coordinate corresponding to a maximum pixel value among (X+1, Y), (X, Y+1), and (X+1, Y+1) is determined as a coordinate of a (P+1)-th downward pattern pixel, and
wherein the upward tracing scheme is a left upward tracing scheme such that when (X, Y) is a coordinate of an S-th upward pattern pixel, a coordinate corresponding to a maximum pixel value among (X−1, Y), (X, Y−1), and (X−1, Y−1) is determined as a coordinate of an (S+1)-th upward pattern pixel.

15. The method of claim 10, further comprising:
providing a cropped image having a predetermined size and centered on the location of the dislocation core, wherein the cropped image corresponds to a portion of the measured TEM image or a portion of the enforced image.

16. The method of claim 7, wherein generating the plurality of virtual TEM images includes:
dividing the incident plane of an electromagnetic wave into a plurality of domains;
setting each of the plurality of three-dimensional structural defects as an arrangement of atoms disposed at corresponding locations on the incident plane; and
calculating pixel values of each of the plurality of virtual TEM images corresponding to one of the plurality of three-dimensional structural defects using the following equation, $$P(\vec{r}) = \sum_R I(\vec{r}, \vec{R}) = \sum_R A \cdot \exp\left(\frac{-|\vec{r} - \vec{R}|^2}{B}\right)$$

where $\vec{r}$ is a position vector of a pixel on each virtual TEM image, $\vec{R}$ is a position vector of an atom in each domain, $P(\vec{r})$ is a pixel value at $\vec{r}$, A indicates a first parameter, and B is a second parameter.

17. The method of claim 16, wherein the atoms are arranged such that a dislocation core of the each of the plurality of three-dimensional structural defects is disposed at a center of the incident plane.

18. The method of claim 16, further comprising:
tuning the first parameter and the second parameter such that each of the plurality of virtual TEM images approaches a real TEM image.

19. The method of claim 7, wherein determining the defect type of the measured TEM image includes:
determining a matched virtual TEM image that is most similar to the measured TEM image among the plurality of virtual TEM images by performing machine learning; and
determining a three-dimensional structural defect corresponding to the matched virtual TEM image as the defect type of the measured TEM image.

20. A method of analyzing a crystal defect, comprising:
capturing an image of a specimen having a crystal structure to generate a measured transmission electron microscope (TEM) image;
generated an enforced image by increasing a contrast of the measured TEM image;
tracing a first atomic arrangement pattern in a lattice direction using the enforced image to detect a defect line including defect pixels that are deviated from a periodicity of the first arrangement pattern;
determining a location of an end point of the defect line as a location of a dislocation core;
generating a cropped image having a predetermined size and centered on the location of the dislocation core, wherein the cropped image corresponds to a portion of the measured TEM image or a portion of the enforced image;
generating a plurality of virtual TEM images corresponding to a plurality of three-dimensional structural defects of the crystal structure, where each virtual TEM image is formed from a plurality pixels representing atoms of the crystal structure disposed on an incident plane having a second atomic arrangement pattern where at least one of the plurality of pixels is deviated from a periodicity of the second atomic arrangement pattern to generate the corresponding three-dimensional structural defect; and
determining a defect type of the measured TEM image by comparing the cropped image with the plurality of virtual TEM images.

* * * * *